(12) United States Patent
Kim et al.

(10) Patent No.: US 12,218,148 B2
(45) Date of Patent: Feb. 4, 2025

(54) DISPLAY MODULE HAVING GLASS SUBSTRATE FORMED WITH SIDE WIRINGS AND METHOD FOR MANUFACTURING SAME

(71) Applicant: SAMSUNG ELECTRONICS CO., LTD., Suwon-si (KR)

(72) Inventors: Jeongyun Kim, Suwon-si (KR); Hosuk Kang, Suwon-si (KR); Jinwoo Jung, Suwon-si (KR); Changjoon Lee, Suwon-si (KR); Tackmo Lee, Suwon-si (KR); Gyun Heo, Suwon-si (KR); Soonmin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 575 days.

(21) Appl. No.: 17/512,126

(22) Filed: Oct. 27, 2021

(65) Prior Publication Data

US 2022/0052080 A1 Feb. 17, 2022

Related U.S. Application Data

(63) Continuation of application No. PCT/KR2021/005551, filed on May 3, 2021.

(30) Foreign Application Priority Data

May 8, 2020 (KR) .................. 10-2020-0054878
Mar. 4, 2021 (KR) .................. 10-2021-0028573

(51) Int. Cl.
*H01L 27/12* (2006.01)
*H01L 25/16* (2023.01)

(52) U.S. Cl.
CPC .......... *H01L 27/124* (2013.01); *H01L 25/167* (2013.01); *H01L 27/1262* (2013.01); *H01L 27/1218* (2013.01)

(58) Field of Classification Search
CPC .... H01L 27/124; H01L 25/167; H10K 59/131
See application file for complete search history.

(56) References Cited

U.S. PATENT DOCUMENTS

| 5,894,170 A | 4/1999 | Ishikawa |
| 7,659,038 B2 | 2/2010 | Nellissen |
| (Continued) | | |

FOREIGN PATENT DOCUMENTS

| JP | 58-169174 A | 10/1983 |
| JP | 2930025 B2 | 8/1999 |
| (Continued) | | |

OTHER PUBLICATIONS

International Search Report (PCT/ISA/210) issued by the International Searching Authority in International Application No. PCT/KR2021/005551, issued on Aug. 17, 2021.

(Continued)

*Primary Examiner* — Peter M Albrecht
(74) *Attorney, Agent, or Firm* — Sughrue Mion, PLLC

(57) ABSTRACT

Provided is a display module including a glass substrate, a thin film transistor (TFT) layer provided on a front surface of the glass substrate, a driving circuit provided on a rear surface of the glass substrate and configured to drive the TFT layer, a plurality of light emitting diodes (LED) electrically connected to the TFT layer, a plurality of first connection pads provided at intervals in a portion of the front surface of the glass substrate and electrically connected to a TFT circuit provided in in the TFT layer, a plurality of second connection pads provided at intervals in a portion of the rear surface of the glass substrate and electrically connected to the driving circuit, and a plurality of side wirings extending from the lateral surface of the glass substrate to a portion of an insulating layer and extending to another portion of the insulating layer.

20 Claims, 33 Drawing Sheets

(56) References Cited

U.S. PATENT DOCUMENTS

| | | | |
|---|---|---|---|
| 9,952,713 | B2 | 4/2018 | Takahashi |
| 10,156,748 | B2 | 12/2018 | Wu et al. |
| 10,930,197 | B2 | 2/2021 | Lee et al. |
| 2016/0095215 | A1 | 3/2016 | Furutani |
| 2017/0148374 | A1 | 5/2017 | Lee et al. |
| 2020/0013803 | A1 | 1/2020 | Jang et al. |
| 2020/0135126 | A1 | 4/2020 | Yokoyama et al. |
| 2020/0203235 | A1* | 6/2020 | Jung .................. H01L 25/167 |
| 2021/0005796 | A1 | 1/2021 | Min et al. |
| 2021/0111324 | A1 | 4/2021 | Chung et al. |
| 2021/0135076 | A1 | 5/2021 | Jung et al. |

FOREIGN PATENT DOCUMENTS

| | | |
|---|---|---|
| JP | 2015-175969 A | 10/2015 |
| JP | 2016-66705 A | 4/2016 |
| JP | 6534381 B2 | 6/2019 |
| KR | 10-2005-0048644 A | 5/2005 |
| KR | 10-2017-0059523 A | 5/2017 |
| KR | 10-2017-0065462 A | 6/2017 |
| KR | 10-2019-0070038 A | 6/2019 |
| KR | 10-2020-0004402 A | 1/2020 |
| KR | 10-2020-0004751 A | 1/2020 |
| KR | 10-2020-0008433 A | 1/2020 |
| KR | 10-2020-0022626 A | 3/2020 |
| KR | 10-2020-0127863 A | 11/2020 |
| KR | 10-2021-0004128 A | 1/2021 |
| KR | 10-2021-0043236 A | 4/2021 |
| WO | 2019/167966 A1 | 9/2019 |
| WO | 2020/072394 A1 | 4/2020 |

OTHER PUBLICATIONS

Written Opinion (PCT/ISA/237) issued by the International Searching Authority in International Application No. PCT/KR2021/005551, issued on Aug. 17, 2021.

Communication dated Oct. 31, 2022 issued by the Korean Intellectual Property Office in Korean Patent Application No. 10-2021-0028573.

Communication issued on May 9, 2023 by the European Patent Office in European Patent Application No. 21800187.3.

* cited by examiner

DISPLAY MODULE HAVING GLASS SUBSTRATE FORMED WITH SIDE WIRINGS AND METHOD FOR MANUFACTURING SAME

CROSS REFERENCE TO RELATED APPLICATIONS

This application is a national stage application of PCT International Application No. PCT/KR2021/005551, filed on May 3, 2021, which claims priority to Korean Patent Application No. 10-2020-0054878, filed on May 8, 2020, and Korean Patent Application No. 10-2021-0028573, filed on Mar. 4, 2021, in the Korean Intellectual Property Office, the disclosures of which are incorporated by reference herein in their entireties.

BACKGROUND

1. Field

The disclosure relates to a display module and a method for manufacturing the same and, more particularly, to a display module having side wirings formed on an edge area of a glass substrate and a method for manufacturing the same.

2. Description of Related Art

A self-emitting display device is a device to display an image without a color filter and a backlight, and may use a light emitting diode (LED)-based inorganic self-emitting device which emits light by itself.

The display module displays various colors while operating in units of pixels or sub-pixels consisting of LED-based inorganic self-emitting devices, and operation of pixel or sub-pixel is controlled by a thin film transistor (TFT). A plurality of TFTs are arranged on a flexible substrate, a glass substrate, or a plastic substrate, and are referred to as TFT substrates.

The TFT substrate is used as a substrate for driving a display by being applied to a small size such as a flexible device, a wearable device (e.g., wearable watch, or the like) and to a large size television (TV) of several tens of inches. In order to drive the TFT substrate, the TFT substrate is connected to an external circuit (IC) or a driver IC capable of applying a current to the TFT substrate. Generally, the TFT substrate and each circuit are connected through chip on glass (COG) bonding or film on glass (FOG) bonding. For this connection, an area having a predetermined space, that is, a bezel area, on an edge of the TFT substrate needs to be secured.

Recently, research and development of a bezel-less technology is being performed to minimize a bezel area to maximize an active area where an image is displayed on a display panel employing a TFT-based substrate.

SUMMARY

Provided are a display module capable of minimizing a wire disconnection rate of the side wirings formed on a glass substrate and a method for manufacturing the same.

Further, provided are a display module including a structure capable of protecting the side wirings formed on a glass substrate from the external impact and a method for manufacturing the same.

Further still, provided are a display module capable of stably coupling side wirings to a glass substrate by widening a contact area on the glass substrate as much as possible.

According to an aspect of the disclosure, there is provided a display module including a glass substrate, a thin film transistor (TFT) layer provided on a front surface of the glass substrate, a driving circuit provided on a rear surface of the glass substrate, the driving circuit being configured to drive the TFT layer, a plurality of light emitting diodes (LED) electrically connected to the TFT layer, a plurality of first connection pads provided at intervals in a portion of the front surface of the glass substrate that is adjacent to a lateral surface of the glass substrate, the plurality of first connections pads being electrically connected to a TFT circuit provided in in the TFT layer through a plurality of first wirings, a plurality of second connection pads provided at intervals in a portion of the rear surface of the glass substrate adjacent to the lateral surface of the glass substrate, the plurality of second connections pads being electrically connected to the driving circuit through a plurality of second wirings, and a plurality of side wirings extending from the lateral surface of the glass substrate to a portion of an insulating layer by passing the first connection pads and extending to another portion of the insulating layer by passing the second connection pads.

The insulating layer may be an organic insulating film or an inorganic insulating film, the insulating layer being provided on the front surface of the glass substrate and the rear surface of the glass substrate.

The insulating layer may include a first insulating layer provided on the front surface of the glass substrate, and a second insulating layer provided on the rear surface of the glass substrate.

The first insulating layer may be spaced apart from the first connection pads, and the second insulating layer is spaced apart from the second connection pads.

The first insulating layer may be provided on a portion of the first connection pads.

The second insulating layer may be provided on a portion of the second connection pads.

A portion of the front surface of the glass substrate that is adjacent to the lateral side of the glass substrate may have an uneven portion, and the first connection pads and one end of the side wirings that are sequentially stacked on the uneven portion may have an uneven shape.

The first connection pads may have an uneven portion, and one end of the side wirings stacked on the uneven portion of the first connection pads may have an uneven shape.

A via structure formed of an insulating material may be provided on the first connection pads, and a portion of the side wirings provided on the via structure may have an uneven shape and may be electrically connected to the first connection pads.

The glass substrate may include an edge area including a first edge zone corresponding to a side surface of the glass substrate, a second edge zone corresponding to a portion of the front surface adjacent to the side surface, and a third edge zone corresponding to a portion of the rear surface adjacent to the side surface, the plurality of side wirings may be provided at predetermined intervals, and each side wiring among the plurality of side wirings may be configured such that a width of a first portion formed in the first edge zone is larger than a width of a second portion formed in the second edge zone and a width of a third portion formed in the third edge zone.

An interval between the first portions of adjacent side wirings may be smaller than a width of each of the second portions and the third portions.

An interval between the first portions of adjacent side wirings may be smaller than an interval between the second portions of the adjacent side wirings and an interval between the third portions of the adjacent side wirings.

The first portion of the side wirings may include a first section extending from a point connected to the second portions to a first predetermined distance away from the second portion and a second section extending from a point connected to the third portion to a second predetermined distance away from the third portion.

The first portion of the side wirings may include a third section with a predetermined width provided between the first second and the second section.

The first edge zone of the glass substrate may include a trench increasing a planar distance of the first portions of adjacent side wirings, the glass substrate may further include an insulating member coupled along the trench, and the insulating member may protrudes higher than the first portions of the side wirings from the side surface of the glass substrate.

According to another aspect of the disclosure, there is provided a display module including a glass substrate, a thin-film-transistor (TFT) layer provided on a front surface of the glass substrate, a driving circuit provided on a rear surface of the glass substrate, the driving circuit being configured to drive the TFT layer, light emitting diodes (LEDs) electrically connected to the TFT layer, first connection pads electrically connected to a TFT circuit provided on the TFT layer provided on a portion of the front surface of the glass substrate that is adjacent to a lateral surface of the glass substrate, second connection pads electrically connected to the driving circuit provided on a portion of the rear surface of the glass substrate adjacent to the lateral surface of the glass substrate, side wirings provided on the first connection pads and the second connection pads, the side wirings being configured to electrically connect the first connection pads and the second connections pads, a first insulating layer provided on the front surface of the glass substrate, and a second insulating layer provided on the rear surface of the glass substrate, wherein the side wirings extend to a portion of the first insulating layer or a portion of the second insulating layer.

The first connection pads or the second connection pads may have an uneven portion, and a portion of the side wirings may be provided on the uneven portion.

A portion of the front surface of the glass substrate or a portion of the rear surface of the glass substrate may have an uneven portion, and a portion of the side wirings may be provided on the uneven portion.

A via structure formed of an insulating material may be provided on the first connection pads, and a portion of the side wirings provided the via structure may have an uneven shape corresponding to the via structure.

The first connection pads, the second connection pads, and the side wirings may be provided at predetermined intervals, and each side wiring among the side wirings may be configured such that a width of first portions provided on the lateral side of the glass substrate is larger than a width of second portions provided on the front surface of the glass substrate and a width of third portions provided on the rear surface of the glass substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
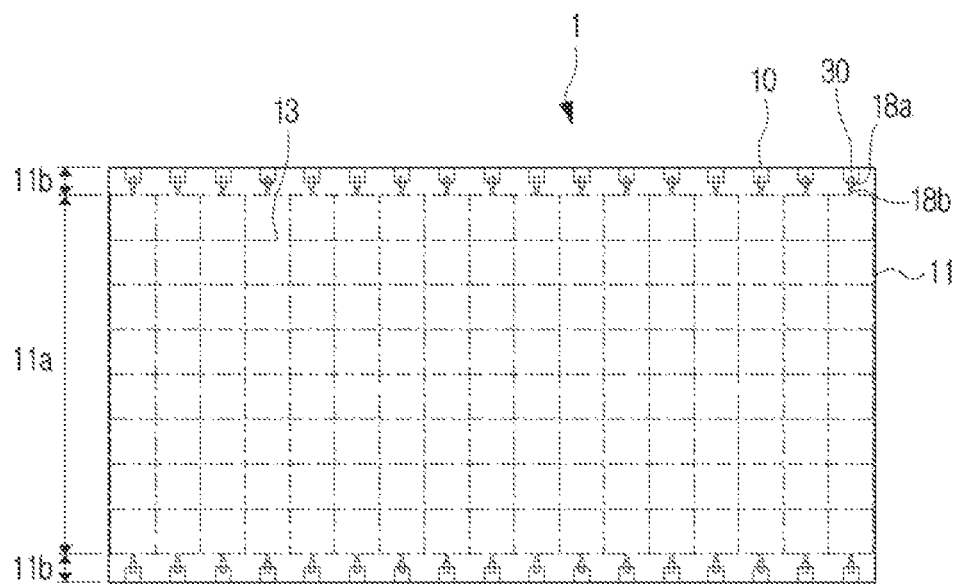
FIG. 1 is a plan view illustrating a display module according to an embodiment of the disclosure.

The embodiments described herein may be variously modified. Specific embodiments are depicted in the drawings and may be described in detail in the description of the disclosure. However, it is to be understood that the particular embodiments disclosed in the appended drawings are for ease of understanding of various embodiments. Therefore, it is intended that the invention not be limited to the particular embodiments disclosed in the accompanying drawings, but on the contrary, the intention is to cover all equivalents or alternatives falling within the spirit and scope of the disclosure.

Terms including an ordinal number such as "first," "second," and the like may be used to describe various components, but the components should not be limited by the terms. The terms are used to distinguish a component from another.

It is to be understood that the terms such as "comprise" or "include" are used herein to designate a presence of a characteristic, number, step, operation, element, component, or a combination thereof, and do not to preclude a presence or a possibility of adding one or more of other characteristics, numbers, steps, operations, elements, components or a combination thereof. It will be understood that when an element is referred to as being "coupled" or "connected" to another element, there may be other elements in the middle, although it may be directly coupled or connected to the other element. In contrast, when an element is referred to as being "directly coupled to" or "directly connected to" another element, there are no elements present therebetween.

In the disclosure, the expression "the same" not only includes complete sameness but also a difference in consideration of a matching error range.

When it is decided that a detailed description for the known art related to the disclosure may unnecessarily obscure the gist of the disclosure, the detailed description may be shortened or omitted.

In the disclosure, the display module may be a micro light-emitting diodes (LED) (micro LED or μLED) display panel. The display module may be a flat display panel and may include a plurality of inorganic LEDs of 100 micrometers or less, respectively. The micro LED display module provides higher contrast, response time and energy efficiency compared to the liquid crystal display (LCD) panel requiring backlight. The organic micro LED and a micro LED which is an inorganic light emitting device both have good energy efficiency, but the micro LED has higher brightness, luminous efficiency, and lifespan than the OLED. The micro LED may be a semiconductor chip capable of emitting light by itself when power is supplied. The micro LED has a faster response rate, low power, and higher luminance. Specifically, micro LEDs are more efficient in converting electricity into photons as compared to liquid crystal displays (LCDs) and organic light-emitting diode (OLED) displays. For example, "brightness per Watt" of micro LEDs may be greater than LCD or OLED displays. In this way, micro LEDs may provide a similar brightness as LED (width, length, and height, respectively, exceed 100 μm) or OLED displays while consuming substantially half as much energy as such display. In addition to the foregoing, micro LEDs are capable of providing high resolution, outstanding color, contrast and brightness, may accurately provide a wide range of colors, and may provide a clear screen even in the outdoors under direct and bright sunlight. In addition, micro LEDs are resistant to burn-in phenomenon, and generate less heat, thereby improving product lifespan without deformations.

In the present disclosure, a micro LED may have a flip-chip structure in which an anode and a cathode electrode are formed on the same first surface and a light emitting surface is formed on a second surface opposite to the first surface on which the electrodes are formed.

In the present disclosure, a TFT layer formed with a TFT circuit may be disposed on the front surface of the glass substrate, and a driving circuit for driving the TFT circuit may be disposed on the rear surface. The TFT circuit may drive a plurality of pixels disposed on the TFT layer.

In the present disclosure, the front surface of the glass substrate may be divided into an active area and a dummy area. The active area may correspond to an area occupied by the TFT layer on the front surface of the glass substrate, and the dummy area may be an area excluding an area occupied by the TFT layer on the front surface of the glass substrate.

In the present disclosure, the edge area of the glass substrate may be the outermost area of the glass substrate. The edge area of the glass substrate may be a remaining area except for the area in which the circuit of the glass substrate is formed. The edge area of the glass substrate may also include a side surface of the glass substrate and a portion of the front surface of the glass substrate adjacent to the side surface and a portion of the rear surface of the glass substrate. The glass substrate may be formed of a quadrangle type. Specifically, the glass substrate may be formed of rectangular or square type. The edge area of the glass substrate may include at least one of four sides of the glass substrate.

In the present disclosure, a plurality of side wirings may be formed at regular intervals in an edge area of the glass substrate. The plurality of side wirings may be electrically connected to a plurality of first connection pads formed in an edge area included in the front surface of the glass substrate, and the other end may be electrically connected to a plurality of second connection pads formed in an edge area included in the rear surface of the glass substrate. The plurality of first connection pads may be connected to a TFT circuit disposed on the front surface of the glass substrate through the wirings and the plurality of second connection pads may be connected to a driving circuit disposed on the rear surface of the glass substrate through the wirings.

In the present disclosure, the display module may achieve bezel-less feature by minimizing a dummy area on the front surface of the TFT substrate and maximizing the active area as the plurality of side wirings are formed, and the mounting density of the micro LED to the display module may be improved. As described above, the display module implementing bezel-less feature may provide a large format display (LFD) device capable of maximizing an active area when a plurality of displays are connected. In this example, each display module may be configured to maintain a pitch between each of the pixels of the adjacent display module equal to a pitch between each of the pixels in a single display module as the dummy area is minimized. Accordingly, it is possible to prevent a seam from appearing at a connection portion between the respective display modules.

In the present disclosure, an edge in an edge area included in the dummy area of the glass substrate may be chamfered to form a chamfer surface having a predetermined angle. The chamfer surface may be formed at an edge between a front surface and a side surface of the glass substrate and an edge between the rear surface and the side surface of the glass substrate. When the side wirings are formed by laser processing, an irradiation section of the laser beam may be spaced apart from the front surface and the rear surface of the glass substrate by a predetermined distance so that various elements or circuits mounted on the front surface and the rear surface of the glass substrate may be prevented from being damaged by the laser beam.

In the present disclosure, it is described that the edge area provided on the glass substrate has a plurality of side wirings formed therein only at two of four sides of the glass substrate, but embodiments are not limited thereto, and a plurality of side wirings may be formed only at one of four sides, or may be formed on at least three sides of the glass substrate.

The display module includes a glass substrate on which a plurality of LEDs are mounted and the side wirings are formed. Such a display module may be installed and applied to a single unit such as a wearable device, a portable device, a handheld device, and an electronic product or electronic parts which require various display devices, and may be applied to a display device such as a personal computer (PC) monitor, a high-resolution TV, and a signage (or digital signage), an electronic display, and the like, through a plurality of assembly arrangements in a matrix type.

Hereinafter, a display module having a glass substrate on which the side wirings are formed according to an embodiment of the disclosure will be described with reference to the drawings.

Figure 2:
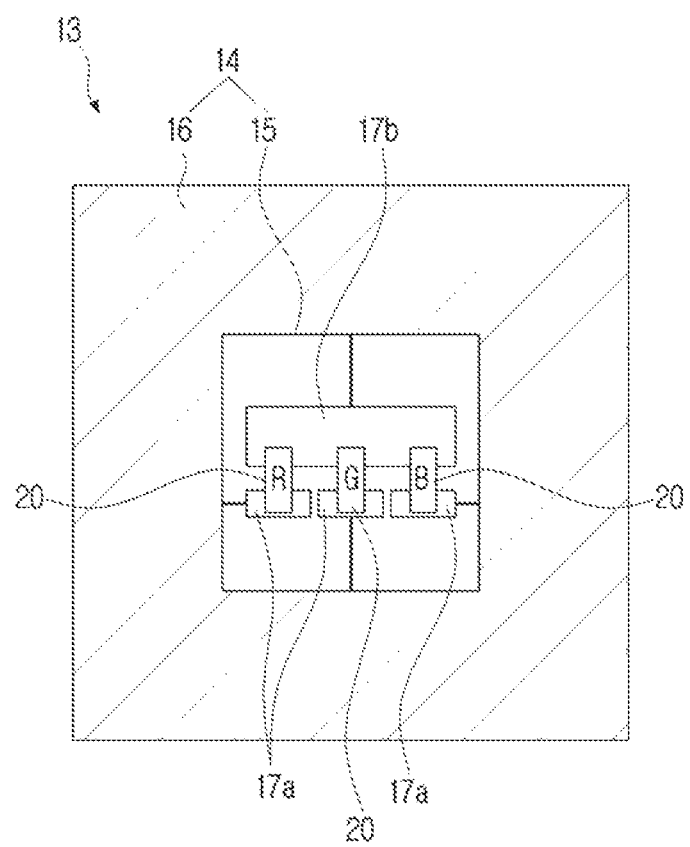
FIG. 2 is a diagram illustrating a pixel arranged in a TFT layer.
Figure 3:
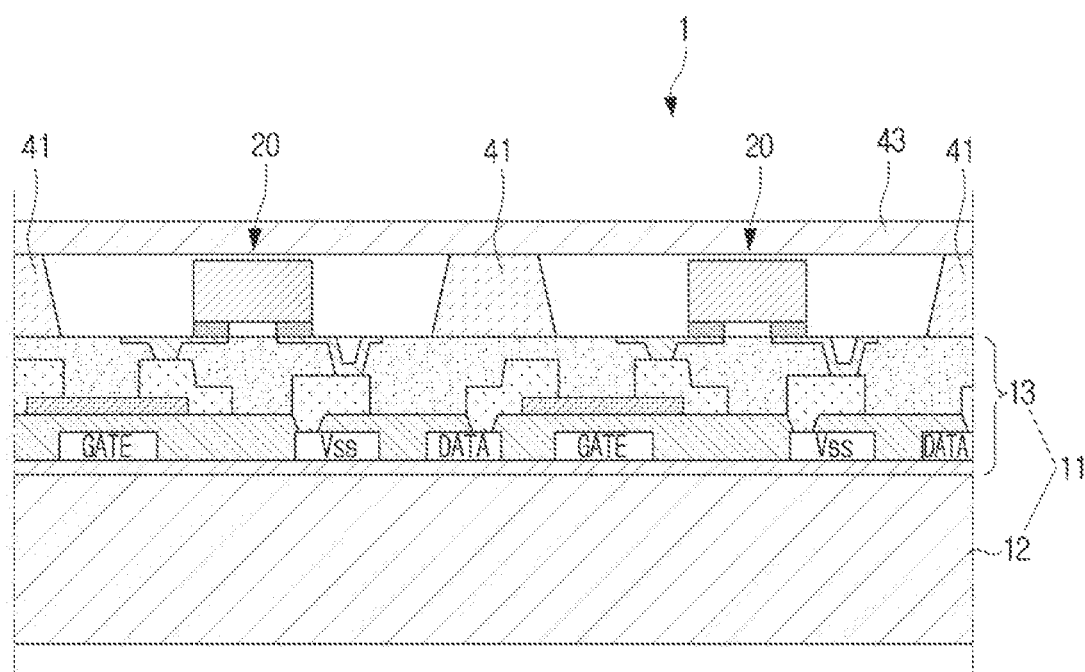
FIG. 3 is a cross-sectional view illustrating a display module according to an embodiment of the disclosure.

FIG. 1 is a plan view illustrating a display module according to an embodiment of the disclosure, FIG. 2 is a diagram illustrating a pixel arranged in a TFT layer, and FIG. 3 is a cross-sectional view illustrating a display module according to an embodiment of the disclosure.

Referring to FIGS. 1 to 3, a display module 1 according to the disclosure may include a TFT substrate 11.

The display module 1 may include a plurality of micro LEDs 20 arranged on the TFT substrate 11. The plurality of micro LEDs may be sub-pixels forming a single pixel. In the present disclosure, a micro LED may be a sub-pixel.

The TFT substrate 11 may include a glass substrate 12, a TFT layer 13 including a TFT circuit on the front surface of the glass substrate 12, and a plurality of side wirings 30 electrically connecting the TFT circuit of the TFT layer 13 and circuits disposed on the rear surface of the glass substrate 12. The TFT substrate 11 includes an active area 11a representing an image and a dummy area 11b that cannot represent an image on the front surface.

The active area 11a may be segmented into a plurality of pixel areas 13 in which a plurality of pixels are arranged, respectively. The plurality of pixel areas 13 may be segmented in various shapes, and may be segmented in, for example, a matrix shape. Each pixel area 13 may include a sub-pixel area 15 on which multi-color micro LEDs, which are a plurality of sub-pixels, are mounted and a pixel circuit area 16 for driving each sub-pixel.

The plurality of micro LEDs 20 may be transferred to the pixel circuit area 16 of the TFT layer 11b, and the electrode pads of each micro LED 20 may be electrically connected to the electrode pads 17a and 17b formed in the TFT layer 11b, respectively. A common electrode pad 17b may be formed in a linear shape in consideration of the arrangement of the three micro LED modules 20 arranged side by side.

The pixel driving method of the display module 1 according to an embodiment of the disclosure may be an active matrix (AM) driving method or a passive matrix (PM) driving method. The display module 1 may form a pattern of wirings in which each micro LED is electrically connected according to an AM driving method or a PM driving method.

The dummy area 11b may be included in the edge area of the glass substrate 12, and a plurality of first connection pads 18a may be disposed at regular intervals. The plurality of first connection pads 18a may be electrically connected to each of the sub-pixels through the interconnection 18b, respectively.

The number of the first connection pads 18a formed in the dummy area 11b may vary depending on the number of pixels implemented on the glass substrate and may vary depending on the driving method of the TFT driving circuit disposed in the active area 11a. For example, the TFT circuit disposed on the active area 11a being driven in the AM driving method which individually drives each pixel may require more wirings and connection pads than the PM driving method which drives a plurality of pixels in a vertical line and a horizontal line.

FIG. 3 illustrates two sub-pixels among the micro LEDs 20 which are three sub-pixels included in a unit pixel, for convenience.

In the display module 1, a plurality of micro LEDs 20 may be segmented by black matrices 41, respectively, and a transparent cover layer 43 for protecting the plurality of micro LEDs 20 together with the black matrix 41 may be provided on the micro LEDs 20 and the black matrix 41. In this example, a touch screen panel may be stacked on one surface of the transparent cover layer 43.

The plurality of micro LEDs 20 may be made of an inorganic light emitting material, and may be a semiconductor chip capable of emitting light by itself when power is supplied.

The plurality of micro LEDs 20 may be a square type having the predetermined thickness and the same width and length, or a rectangular type having a different width and length. Such a micro LED may realize a real high dynamic range (HDR) and may improve brightness and black representation and a high contrast ratio compared to an OLED. The size of the micro LED may be, for example, 100 µm or less, or preferably 30 µm or less. However, embodiments are not limited thereto.

The plurality of micro LEDs 20 may be a flip chip structure in which the anode and cathode electrodes are formed on the same surface and the light-emitting surface is formed on the opposite surface of the electrodes.

Figure 4A:
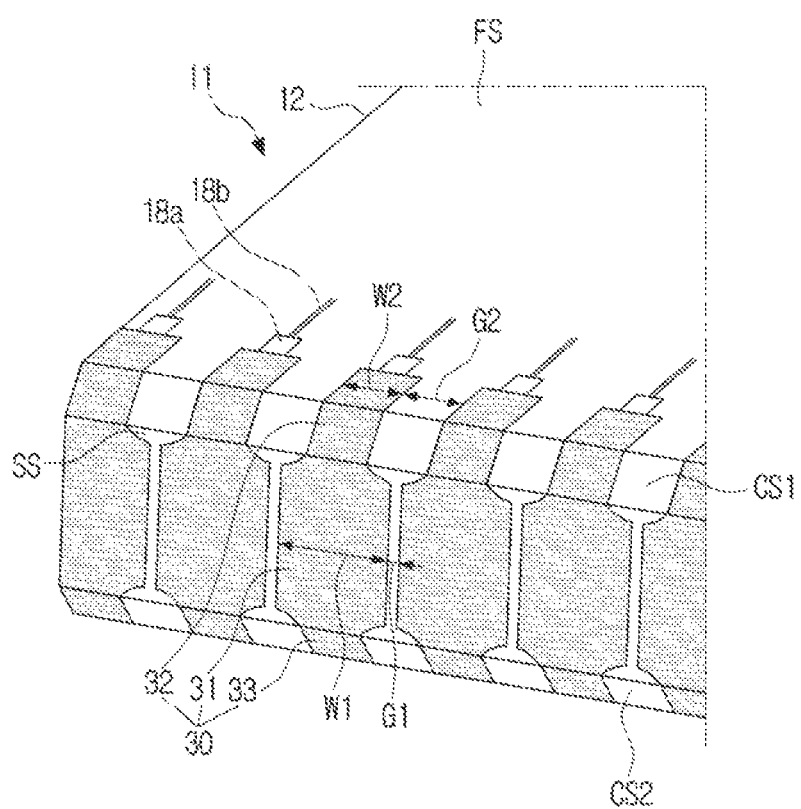
FIG. 4A is a perspective view illustrating an example of forming a plurality of side wirings along a side surface of a glass substrate portion at intervals, by enlarging a portion of a front surface of the glass substrate according to an embodiment of the disclosure.
Figure 4B:
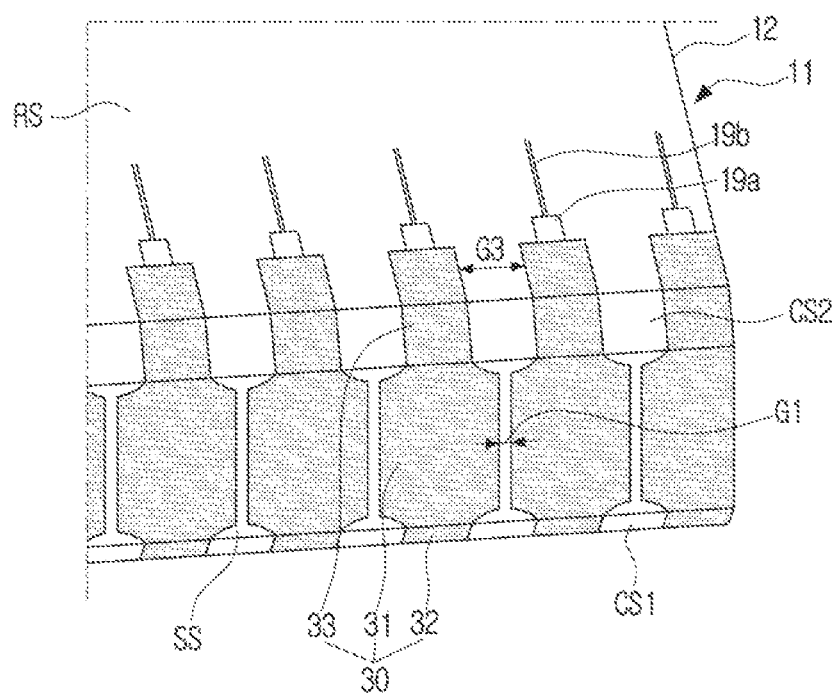
FIG. 4B is an enlarged perspective view of enlarging a portion of the rear surface of the glass substrate shown in FIG. 4A.

FIG. 4A is a perspective view illustrating an example of forming a plurality of side wirings along a side surface of a glass substrate portion at intervals, by enlarging a portion of a front surface of the glass substrate according to an embodiment of the disclosure; and FIG. 4B is an enlarged perspective view of enlarging a portion of the rear surface of the glass substrate shown in FIG. 4A.

Referring to FIGS. 4A and 4B, in the disclosure, the edge area of the glass substrate 12 may include a plurality of edge zones located on each side of the glass substrate 12.

The plurality of edge zones of the glass substrate 12 may include a first edge zone corresponding to the entire side surface SS of the glass substrate 12, a second edge zone corresponding to a portion of a front surface FS of the glass substrate 12 adjacent to the SS of the glass substrate 12, and a third edge zone corresponding to a portion of a rear surface (RS side) of the glass substrate 12 adjacent to the SS of the glass substrate 12 may be included.

In this example, the second edge zone may include a first chamfer surface CS1 chamfered between the side surface SS of the glass substrate 12 and the front surface FS of the glass substrate 12, and the third edge zone may include a second chamfer surface CS2 chamfered between the side surface SS of the glass substrate 12 and the rear surface RS of the glass substrate 12.

The side wirings 30 may electrically connect a first connection pad 18a formed on the second edge zone and a second connection pad 19a formed on the third edge zone.

The first connection pad 18a may be formed at regular intervals along the second edge zone. A portion of the first connection pad 18a may be electrically connected through a wiring 18b provided in the TFT layer 13. In this example, the wiring 18b may be a gate signal wiring or a data signal wiring of the TFT layer 13.

A plurality of the second connection pad 19a may be formed at regular intervals along the third edge zone. The second connection pad 19a may be connected to the first connection pad 18 through the side wirings 30, and may be connected to the driving circuit formed on the rear surface RS of the glass substrate through the wiring 19b.

The side wirings 30 may have one end electrically connected to the first connection pad 18a and the other end electrically connected to the second connection pad 19a.

The side wirings 30 may include a first portion 31 formed in the first edge zone, a second portion 32 formed in the second edge zone, and a third portion 33 formed in the third edge zone. The first, second, and third portions 31, 32, 33 are formed to be continuously connected.

The side wirings 30 having a fine width may be disconnected by an external impact during processing or transporting the glass substrate 12. The first portion 31 of the side wirings formed in the first edge zone may be easily disconnected when being scratched or stabbed by colliding with a peripheral structure (e.g., equipment used in the process, etc.).

In order to prevent the side wirings 30 from being disconnected, the first portion 31 of the side wirings may be formed to have a width W1 as wide as possible. In this example, the side wirings 30 may maintain an interval G1 that is not short-circuited with the first portion of the other adjacent side wirings.

The width W2 of the second and third portions 32 and 33 of the side wirings may be identical to each other. The width W2 of the second and third portions 32 and 33 may have an error range generated when the side wirings are formed and may be substantially the same.

The width W1 of the first portion 31 of the side wirings may be formed to be greater than the width W2 of the second and third portions 32, 33.

The first interval G1 between the first portions 31 of the adjacent side wirings is smaller than the second interval G2 between the second portions 32 of the adjacent side wiring and less than the third interval G3 between the third portions 32 of the side wirings. The width W1 of the first portion 31 of the side wirings may satisfy Equation 1 below.

$$W1=W2+G2-G1 \quad \text{(Equation 1)}$$

In this example, the width W1 of the first portion 31 of the side wirings may be within the same range as Equation 2 below.

$$W2+G2-G1_{max}<W1<W2+G2-G1_{min} \quad \text{(Equation 2)}$$

Here, $G1_{max}$, which is the maximum value of G1, and $G1_{min}$, which is the minimum value of G1, may correspond to each example shown in Table 1 below. Table 1 shows several examples of the range of G1, however the range of G1 according to embodiments are not be limited to Table 1.

TABLE 1

| | Range of G1 |
|---|---|
| Example 1 | 0 < G1 ≤ 5 |
| Example 2 | 5 < G1 ≤ 10 |
| Example 3 | 10 < G1 ≤ 20 |
| Example 4 | 20 < G1 ≤ 50 |
| Example 5 | 50 < G1 ≤ 100 |

The width W1 of the first portion 31 of the side wirings may satisfy Equation 3 below, and the width W1 of the first portion 31 of the side wirings may satisfy Equation 4 below.

$$W1=W2+G3-G1 \quad \text{(Equation 3)}$$

$$W2+G3-G1_{max}<W1<W2+G3-G1_{min} \quad \text{(Equation 4)}$$

Figure 5:
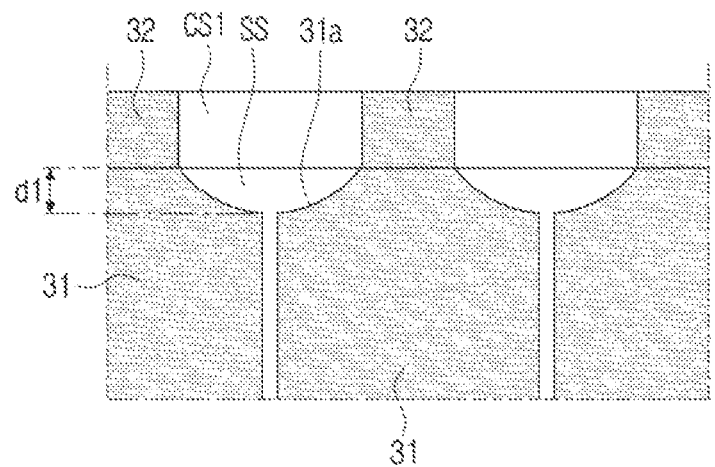
FIGS. 5 and 6 are enlarged views of a portion of the side wirings formed on a side surface of a glass substrate.
Figure 6:
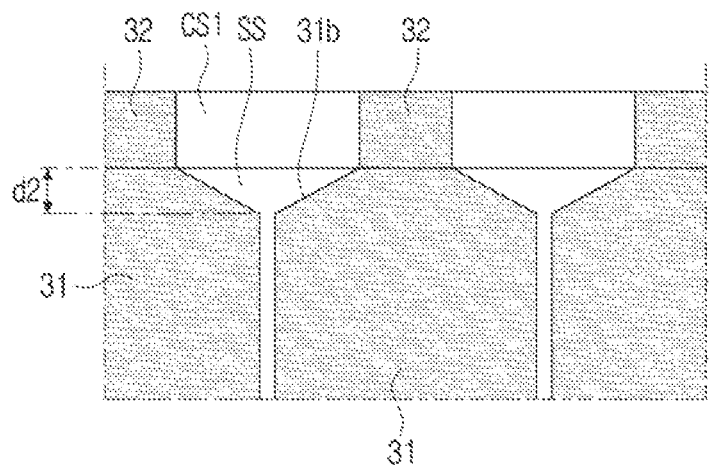

FIGS. 5 and 6 are enlarged views of a portion of the side wirings 30 formed on a side surface of a glass substrate 12.

Referring to FIG. 5, the first portion 31 of the side wirings 30 may include a section that gradually extends from a point connected to the second portion 32 to a predetermined distance d1 away from the second portion 32 while forming an arc shape 31a. Similarly, the first portion 31 of the side wirings may include a section extending gradually from a point connected to the third portion 33 to a predetermined distance away from the third portion 33, while forming an arc shape. In this example, the first portion 31 may include a section formed with a constant width between the extended sections of both sides.

The first portion 31 of the side wirings may be formed when a mask 70, which will be described later, covers a portion of the side surface SS of the glass substrate 12 in a masking process of forming the mask 70, which will be described later, on the glass substrate 12.

The arc shape 31a of the first portion 31 of the side wirings may induce the laser beam to be processed only within the side surface SS of the glass substrate 12 without invading the first chamfer surface CS1 when the side wirings are formed by laser processing, which will be described later. Accordingly, it is possible to prevent or reduce various problems that may occur as the laser beam is reflected to the peripheral structure at the first chamfer surface CS1 of the glass substrate during laser processing.

Referring to FIG. 6, the first portion 31 of the side wirings may gradually extend from a point connected to the second portion 32 to a predetermined distance d2 away from the second portion 32, while forming a straight line shape 31b.

The manufacturing process of the display module according to an embodiment will be briefly described with reference to the drawings.

Figure 7:
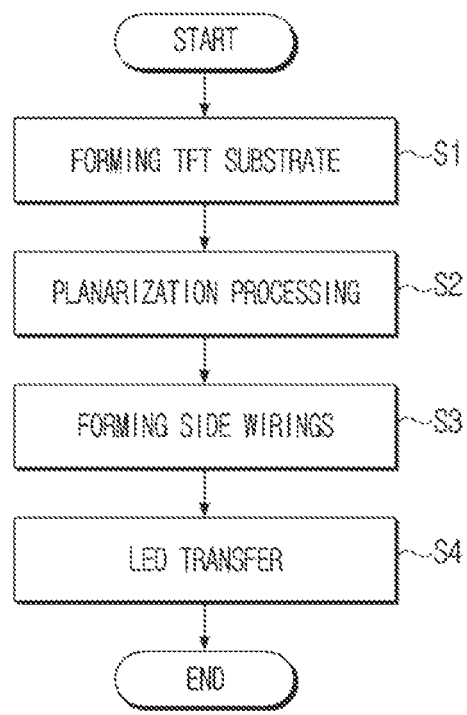
FIG. 7 is a flowchart illustrating a manufacturing process of a display module according to an embodiment of the disclosure.

FIG. 7 is a flowchart schematically illustrating a manufacturing process of a display module according to an embodiment of the disclosure.

The TFT film 13 is formed on the glass substrate 12 by forming the TFT layer 13 (S1). The TFT layer 13 may be any one of a low temperature poly silicon (LTPS) TFT, a-Si TFT, or an oxide TFT. In this example, the TFT layer 13 may be integrally formed on one surface of the glass substrate 12.

The TFT layer 13 may be separately manufactured from the glass substrate 12 in the form of a thin film, and may be firmly attached to one surface of the glass substrate 12 through a coating processing such as laminating.

The edge area where the side wirings 30 are to be formed on the glass substrate 12 is grounded and planarized (S2). This is to enable the side wirings 30 formed in the edge area of the glass substrate 12 to be firmly formed without being separated from the glass substrate 12.

During the planarization process, the edges which are the boundaries of the first and second edge zones and edges which are the boundaries of the first and third edge zones are chamfered at the edge area of the glass substrate 12 to form the first and second chamfer surfaces CS1 and CS2.

When the side wirings 30 are formed by laser processing (S3), the first and second chamfer surfaces CS1 and CS2 make a laser beam irradiation section be spaced apart from the front surface FS and the rear surface RS of the glass substrate 12 by a predetermined distance substrate to prevent or reduce damages to various elements or circuits mounted on the front surface FS and the rear surface RS of the glass substrate 12 by radiation by the laser beam.

The side wirings 30 are formed in an edge area of the glass substrate 12. The side wirings 30 may be formed by a variety of methods. For example, the side wirings 30 may be formed by applying a conductive metal material onto an edge area of the glass substrate through an ink jet method, a stamping method, a screen printing method, a spray method, or metal deposition method by a sputtering method.

In this example, the side wirings 30 are formed in the same shape with a predetermined interval in the edge area of the glass substrate. The side wirings 30 may be formed so that the first portion 31 formed in the first edge zone has a width W1 that is wider than the width W2 of the second and third portions 32 and 33 formed in the second and third edge zones.

After forming the side wirings 30 in the edge area of the glass substrate 12, a plurality of micro LEDs arranged on the transfer substrate are transferred to the TFT layer of the TFT substrate which is a target substrate (S4).

The display module 1 according to an embodiment may be manufactured through the above process. Hereinafter, a method of forming the side wirings in an edge area of a glass substrate will be described.

Figure 8:
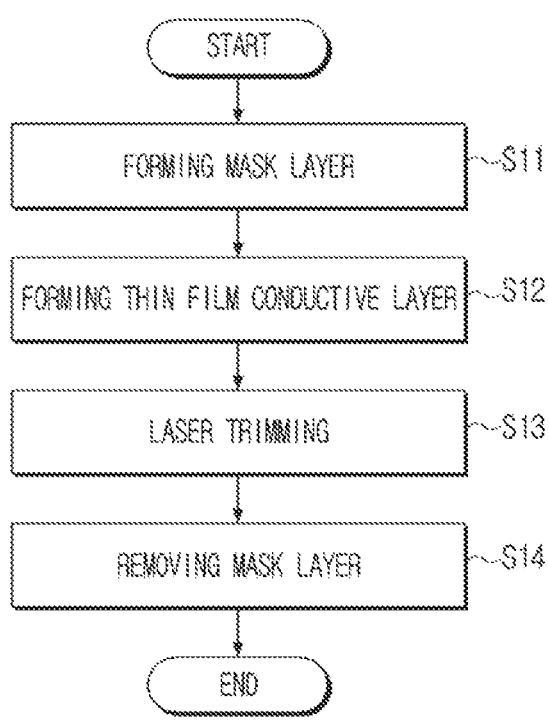
FIG. 8 is a flowchart illustrating a process of forming the side wiring in an edge area of a glass substrate.

FIG. 8 is a flowchart illustrating a process of forming the side wiring 30 in an edge area of a glass substrate, and FIGS. 9 to 16 are views sequentially illustrating a process of forming the side wirings.

Figure 9:
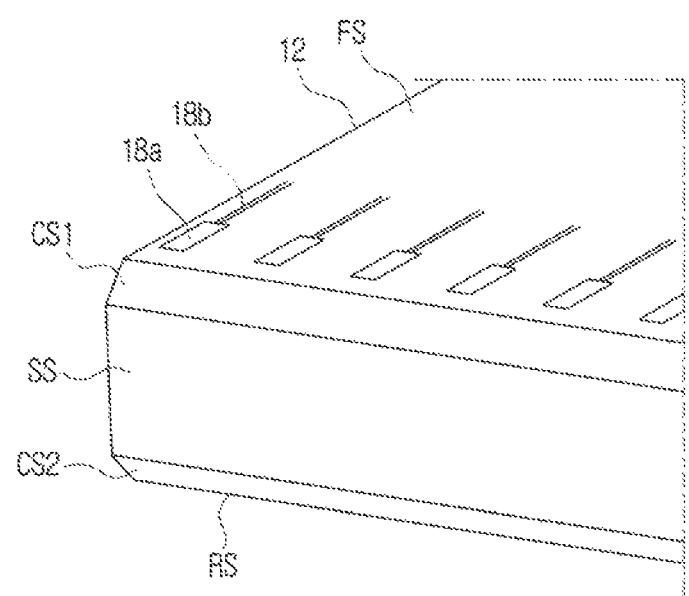
FIGS. 9, 10, 11, 12, 13, 14, 15, and 16 are views sequentially illustrating a process of forming the side wirings.

Referring to FIG. 9, the glass substrate 12 of which edge area including the first, second, and third edge zones is planarized is provided.

Figure 10:
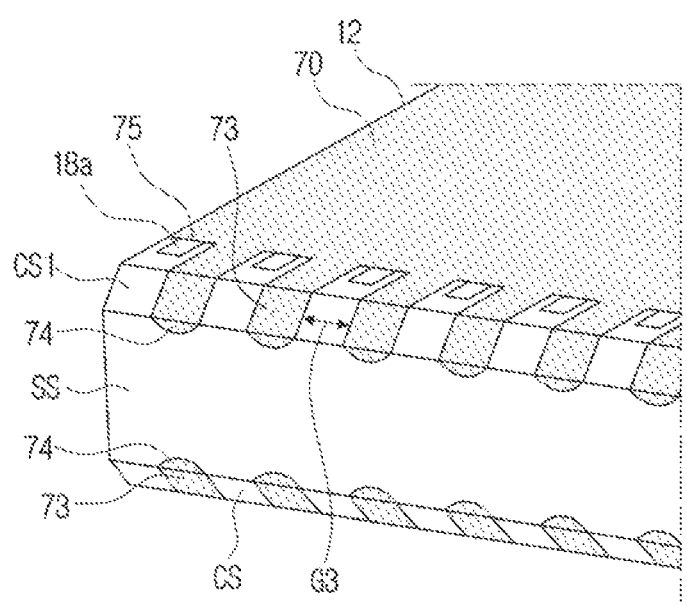

As shown in FIG. 10, the mask layer 70 covering the front surface FS and the rear surface RS of the glass substrate 12 except for a portion where the side wirings 30 are to be formed is formed in the edge area of the glass substrate 12 (S11).

The mask layer 70 may include a plurality of protrusions 73 protruding from the front surface FS of the glass substrate 12 to the first chamber surface CS 1. In this example, each of the protrusions 73 may include an end portion 74 that extends by a predetermined distance to a portion of the side surface SS of the glass substrate 12.

A recess 75 between the plurality of protrusions 73 also covers a portion of the first connection pad 18a. In this example, the remaining portion of the first connection pad 18a not covered by the recess 75 may be covered by the thin conductive layer 80 and may be physically and electrically connected to the thin film conductive layer 80. Similar to the first connection pad 18a, the remaining portion of a second connection pad 19a that is not covered by the recess 75 may be covered by the thin conductive layer 80 and may be physically and electrically connected to the thin film conductive layer 80.

The plurality of protrusions 73 are arranged at a predetermined interval G3, which considers the width W2 (see FIG. 4) of the second portion 32 of the side wirings 30 to be formed later. The interval G3 between each protrusion 73 is the same as the width W2 of the second portion 32 of each of the side wirings.

The mask layer 70 may be formed through one of, for example, a screen printing process, a taping process, and an exposure/development process.

Figure 11:
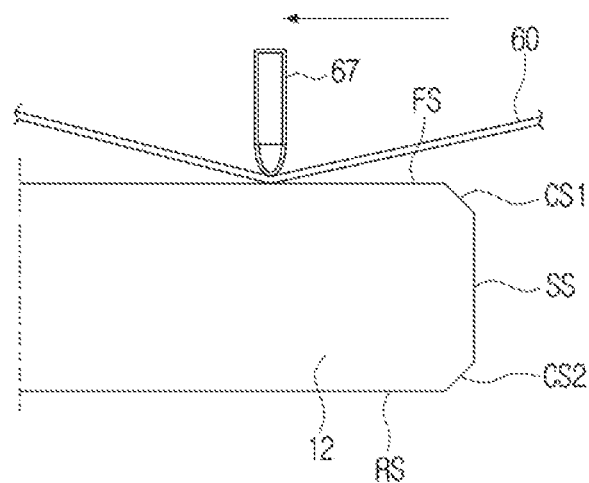

For example, when the mask layer 70 is formed by a screen printing process, as shown in FIG. 11, the screen 60 is disposed at a predetermined interval on the front surface FS of the glass substrate 12.

After applying the paste, which is a material of the mask layer 70, onto the screen 60, rubbing a squeeze 67 from a position that is slightly deviated from the SS of the glass substrate toward the FS of the glass substrate while moving the squeeze 67, the paste passes through the pattern 61 formed on the screen 60, and the mask layer 70 is printed on the glass substrate 12 disposed under the screen 60.

After forming the mask layer 70 on the front surface FS of the glass substrate, the mask layer 70 is formed on the rear surface RS of the glass substrate through the same screen printing process.

Figure 12:
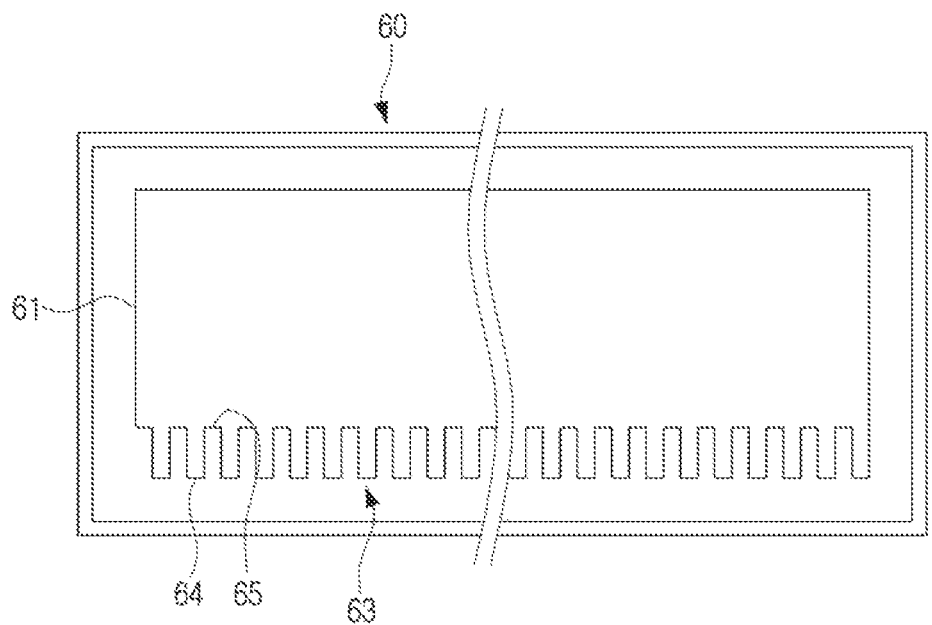

Referring to FIG. 12, the pattern 61 formed on the screen 60 is provided with a plurality of uneven patterns 63 to form a plurality of protrusions 73 of the mask layer 70. The plurality of uneven patterns 63 are alternately and repeatedly formed with protrusions and recesses.

When the screen 60 is spaced apart from the front surface of the glass substrate by a predetermined distance, a front end 64 of the protrusion of the plurality of uneven patterns 63 may be disposed at a position corresponding to the side surface SS of the glass substrate 12, and the front end 65 of the recess may be disposed on the first connection pad 18a. A plurality of protrusions 73 of the mask layer may be formed on the first edge zone of the edge area of the glass substrate 12 by the plurality of uneven patterns 63.

The remaining area except for the first edge zone in the front surface FS of the glass substrate 12 may be entirely covered or partially covered by the mask layer 70 according to the size of the pattern 61. The width of the mask layer 70 covering the front and rear surfaces FS and RS of the glass substrate 12 may vary depending on the subsequent process. For example, after the mask layer 70 is formed, it is desirable to cover the entire surface of each of the front surface FS and the rear surface RS of the glass substrate 12 with the mask layer 70, leaving only an area for forming the side wirings when the conductive thin film is deposited, such as sputtering, to form the side wirings 30. The mask layer 70 may be formed from the front surface FS and the rear surface RS of the glass substrate 12 to an area adjacent to the first edge zone when the post process is performed in one of an ink jet method, a stamping method, and a screen printing method.

When the mask layer 70 is formed on the front surface FS and the rear surface RS of the glass substrate 12, the front end 74 of the plurality of protrusions 73 of the mask layer 70 may be formed to go beyond the side surface SS of the glass substrate 70. This may prevent or reduce damages to the front surface FS and the rear surface RS of the glass substrate 12 when processing the thin conductive layer 80 on the side surface SS of the glass substrate 12. Further, as the laser trimming processing area described below is reduced, there is an advantage that the laser trimming time and man hour may be reduced.

Figure 13:
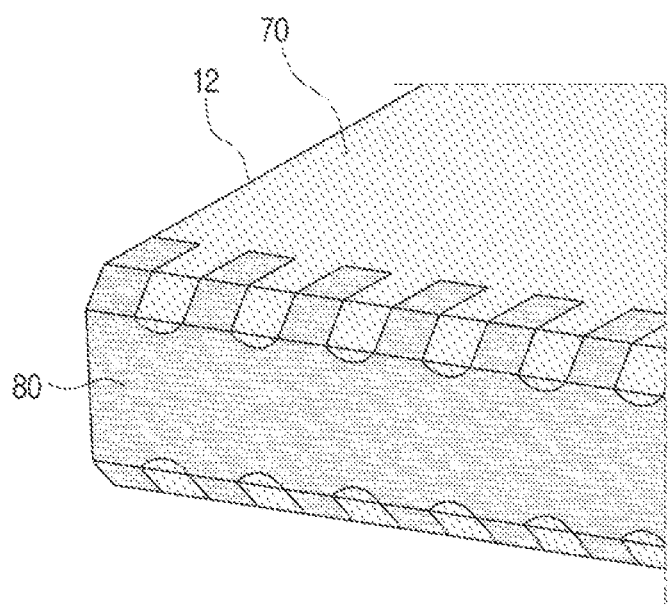

Referring to FIG. 13, after the mask layer 70 is formed, the thin film conductive layer 80 is formed on a portion not covered by the mask layer 70 in the edge area of the glass substrate 12 (S12).

The thin conductive layer 80 may be deposited on an edge area of the glass substrate 12 by, for example, a sputtering method. In the embodiment, a thin film conductive layer 80 is formed by a sputtering method, but is not limited thereto. For example, the thin film conductive layer 80 may be formed by one of an ink jet method, a stamping method, a screen printing method, and a spray method as described above.

After forming the thin conductive layer 80, side wirings 30 are formed by radiating the thin conductive layer 80 through laser trimming to remove a portion of the thin film conductive layer (S13).

Figure 14:
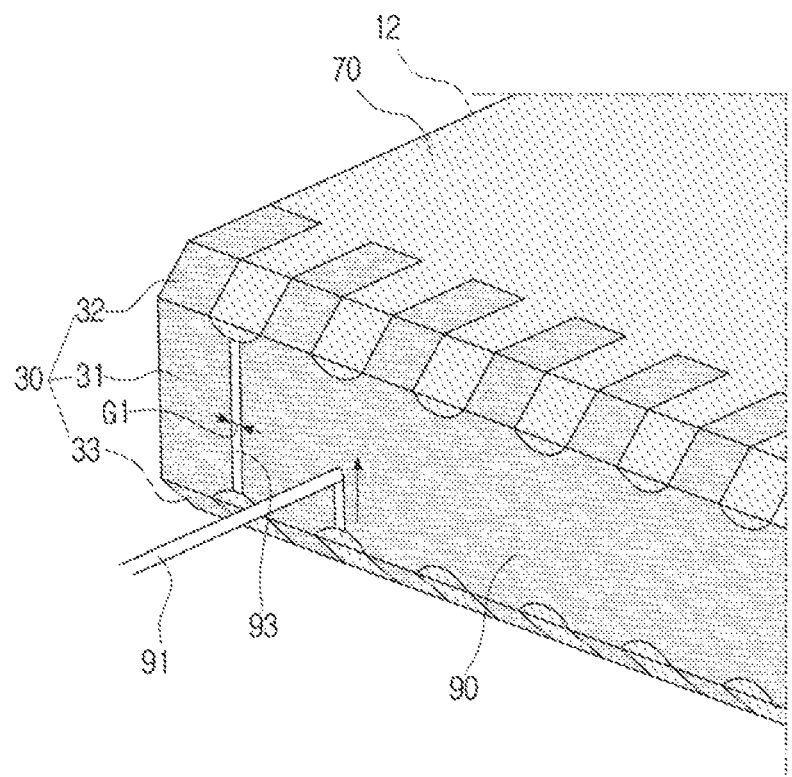

For example, laser beam 91 is radiated along a predetermined virtual line, which is the boundary of each side wirings 30 in the thin film conductive layer 90. Accordingly, as shown in FIG. 14, a portion of the thin film conductive layer 80 may be trimmed by the laser beam, and each of the side wirings 30 may be formed at a predetermined interval G1. The interval G1 between adjacent side wirings 30 may be adjusted according to the focusing depth of the laser beam.

Figure 15:
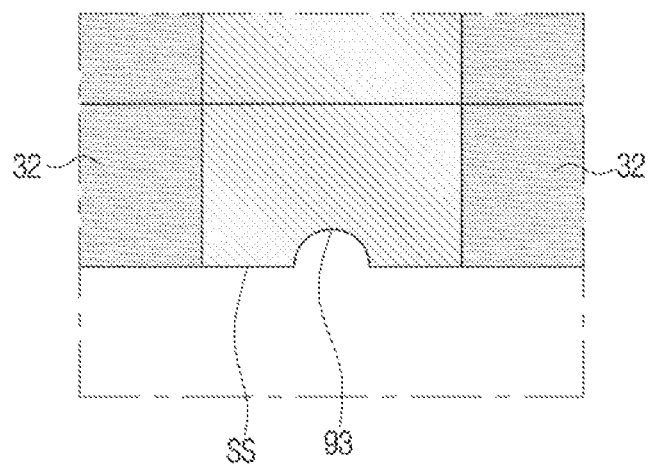

At this time, a trench 93 having a predetermined depth may be formed on the side surface SS of the glass substrate 12 as shown in FIG. 15 while the thin film conductive layer 90 is trimmed by the laser beam between adjacent side wirings 30.

The depth of the trench 93 may be determined by adjusting the focusing of the laser beam. Therefore, only the thin film conductive layer of the adjacent side wirings 30 may be removed without forming the trench 93 by adjusting the focusing of the laser beam.

The trench 93 formed on the side surface SS of the glass substrate may broaden a plane distance between adjacent side wirings, thereby preventing a short circuit due to re-deposition or other foreign substances in the laser trimming. In addition, when foreign substances are adsorbed on the side surface SS of the glass substrate 12, foreign substances may be more easily removed through air spraying or other physical cleaning. It is also possible to fundamentally prevent foreign substances from being adsorbed on the substrate by attaching an insulating protection film, or the like, to the side surface SS of the glass substrate 12. In addition, the durability of the display module 1 may be improved by buffering a decrease in durability due to a difference in thermal expansion coefficients between the glass substrate 12 and the side wirings 30.

Figure 16:
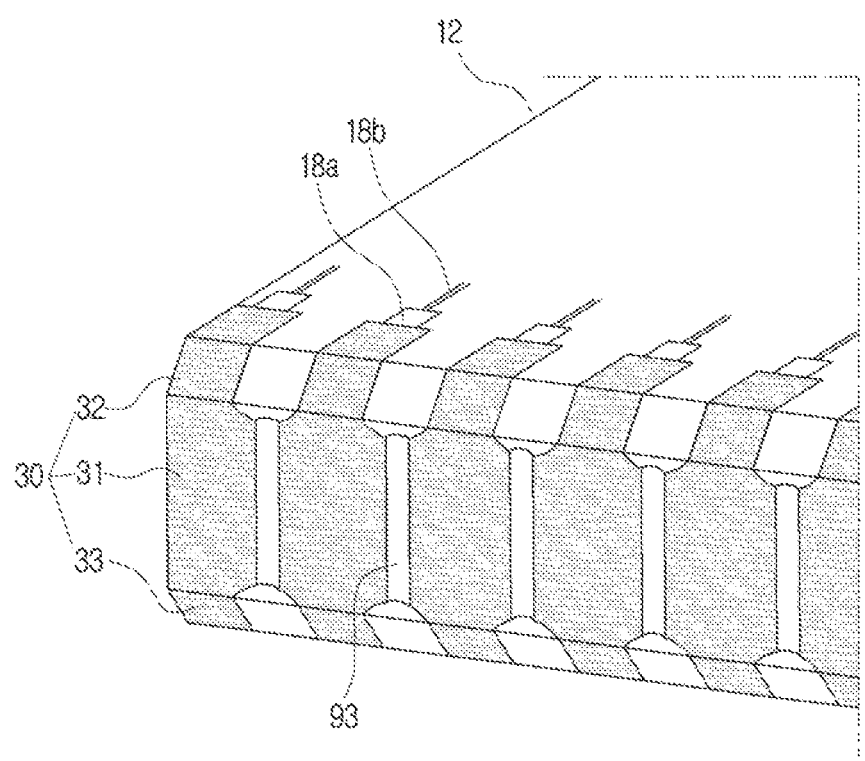

After the laser trimming process, the side wiring process may be completed by removing the mask layer 70 from the glass substrate 12 as shown in FIG. 16 (S14). In addition, the laser trimming process and the mask layer removal process may be performed by changing the order of the laser trimming process and the mask layer removal process.

Although the thin film conductive layer is formed through a deposition process in the embodiment, but embodiments are not limited thereto. For example, the thin film conductive layer may be formed in an edge area of the glass substrate 12 by application of a conductive ink based on, for example, gold (Au), silver (Ag), copper (Cu), etc., when the thin film conductive layer is formed through one of an ink jet method, a stamping method, a spray method, and a screen printing method.

Figure 17:
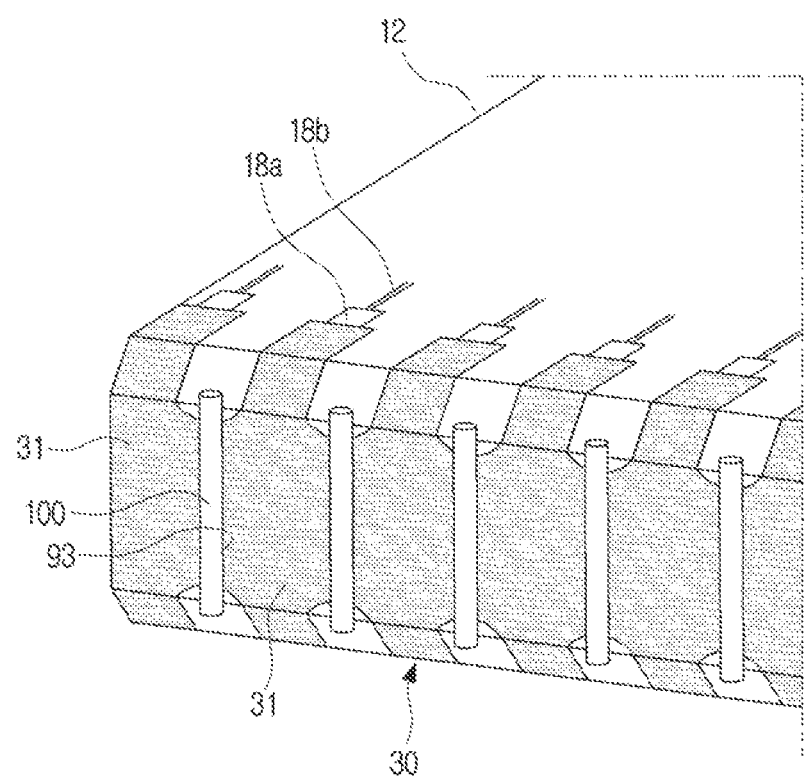
FIG. 17 is a perspective view illustrating an example of coupling an insulating member to a trench formed on a side of a glass substrate.
Figure 18:
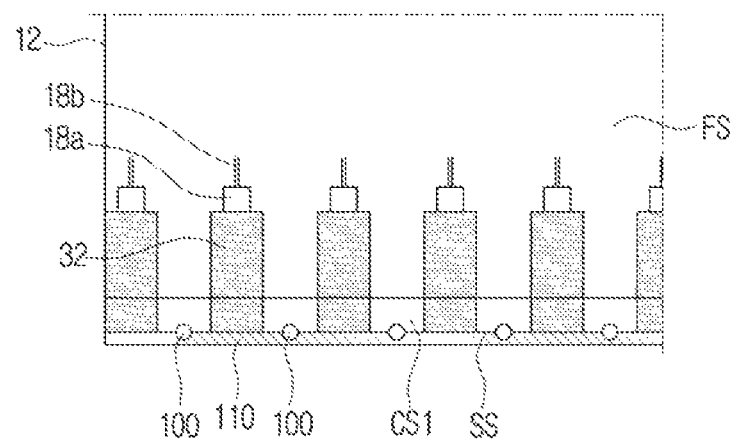
FIG. 18 is a plan view illustrating an example of forming a protective layer on a side of a glass substrate.

FIG. 17 is a perspective view illustrating an example of coupling an insulating member to a trench formed on a side of a glass substrate, and FIG. 18 is a plan view illustrating an example of forming a protective layer on a side of a glass substrate 12.

Referring to FIG. 17, an insulating member 100 may be formed in each trench 93 to protect the side wirings 30 from an external impact. The length of the insulating member 100 may be equal to or longer than the length of the trench 93.

The insulating member 100 may be applied on the trench 93 by a fine dispensing process or the like. In this example, the insulating member 100 may be formed to protrude further than the side surface SS and the side wirings 30 of the glass substrate 12.

The first portion 31 of the side wirings 30 is positioned more inwardly than the insulating member 100 by a step difference formed between the side surface SS of the glass substrate 12 and the insulating member 100. Accordingly, the side wirings 30 may be effectively protected from an external impact applied to the glass substrate 12, thereby improving the durability of the display module 1.

Referring to FIG. 18, a protective layer 110 covering the side surface SS of the glass substrate 12 may be formed as an additional measure for protecting the side wirings 30. The protective layer 110 may be formed of an insulating material.

In this example, the plurality of insulating members 100 may increase the area of contact with the protective layer 110 and may improve the bonding force between the side surface SS of the glass substrate 12 and the protective layer 110 by providing a structure protruding from the side surface SS of the glass substrate 12.

The protective layer 110 may be formed to cover the entire side surface SS of the glass substrate 12 in a state in which the insulating member 100 is not formed in the trench 93. In this example, as a portion of the protective layer 110 is inserted into the trench 93, the contact area with the side surface SS of the glass substrate 12 may increase, thereby improving the bonding force with the SS of the glass substrate 12.

In describing a method of forming the side wirings above, introducing a laser trimming process has been described, but embodiments are not limited thereto. For example, the side wirings may be formed by another method, which will be described below.

Figure 19:
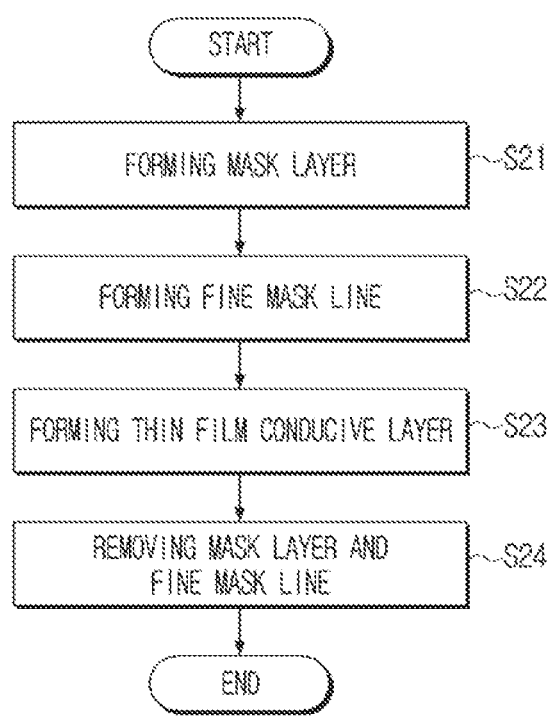
FIG. 19 is a flowchart illustrating another example of a process of forming side wirings in an edge area of a glass substrate.

FIG. 19 is a flowchart illustrating another example of a process of forming side wirings in an edge area of a glass substrate 12.

The mask layer 70 is formed on the glass substrate 12 in the same manner as the method of side wirings described above (S21).

After forming the mask layer 70, a plurality of fine mask lines are dispensed at regular intervals along a predetermined virtual line, which is a boundary between the side wirings 30 on the side surface SS of the glass substrate in S22.

The width of the fine mask line may be an interval G1 between the adjacent side wirings 30.

After forming the fine mask line, the thin film conductive layer 80 is formed on a portion not covered by the mask layer 70 in the edge area of the glass substrate 12 (S23).

In this example, the thin film conductive layer 80 covers a portion not covered by the mask layer 70 in the edge area of the glass substrate 12 and simultaneously covers the plurality of fine mask lines.

Although the thin conductive layer 80 has been described as being deposited on the edge area of the glass substrate 12 by the sputtering method, embodiments are not limited thereto, and may be formed by, for example, one of an ink jet method, a stamping method, a spray method, and a screen printing method.

After forming the thin film conductive layer 80, the mask layer 70 and the fine mask line may be removed together (S24).

In this example, a portion of the thin film conductive layer 80 covering the fine mask line is removed from the side surface SS of the glass substrate 12 along with the fine mask line, and the adjacent side wirings 30 are formed at a predetermined interval G1.

Figure 20:
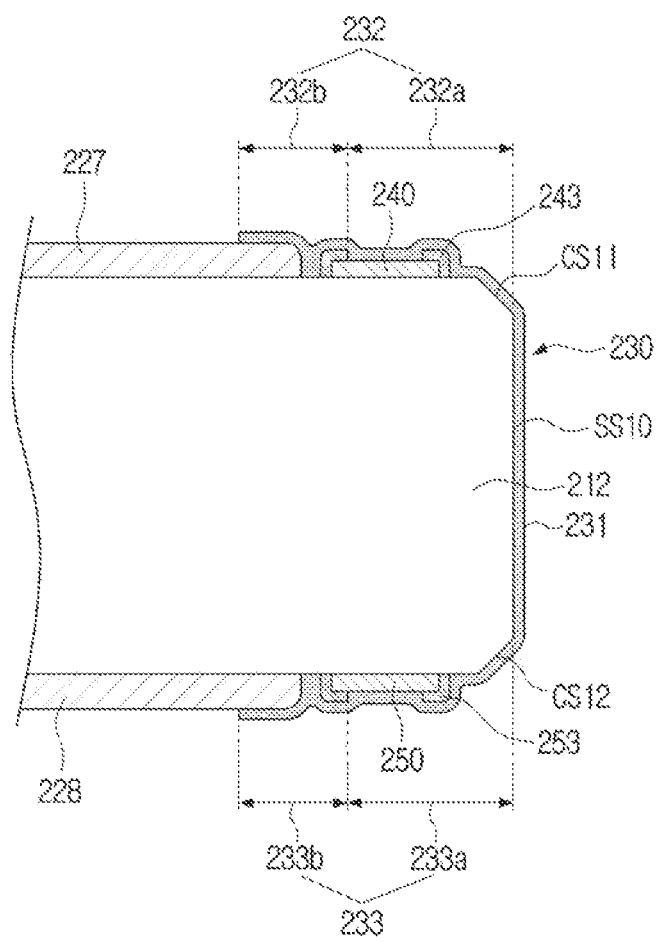
FIG. 20 is a cross-sectional view illustrating an example of covering by side wiring even a portion of an insulating layer formed on a front surface and a rear surface of a glass substrate.

FIG. 20 is a cross-sectional view schematically illustrating an example of covering by side wiring even a portion of an insulating layer formed on a front surface and a rear surface of a glass substrate.

Referring to FIG. 20, the side wirings 230 cover a portion of the first insulating layer 227 in which the second portion 232 is formed on the front surface of the first connection pad 240 and the glass substrate 212. A portion of the first insulating layer 227 may be an edge portion of the first insulating layer 227 adjacent to the first connection pad 240.

An anti-oxidation layer may be formed on the first connection pad 240 to prevent oxidation of the first connection pad 240. In this example, a second portion 232 of the side wirings may be formed on an upper surface of the anti-oxidation layer in the thickness capable of electrical connection between the first connection pad 240 and the second portion 232 of the side wirings.

An inorganic insulating layer 243 may be formed around the first connection pad 240. Accordingly, the first connection pad 240 may be insulated by the inorganic insulating layer 243 along the circumference of the first connection pad 240.

The first insulating layer 227 formed on the front surface of the glass substrate 212 may be formed of an organic insulating layer or an inorganic insulating layer or a structure in which an inorganic insulating layer and an organic insulating layer are stacked. The edge portion of the first insulating layer 227 may be spaced apart from the first connection pad 240 by a predetermined distance.

The second portion 232 of the side wirings may be divided into two areas 232a and 232b. The first area 232a may be an area extending from the first portion 231 of the side wirings and covering the first chamfer surface CS11 of the glass substrate 212 and completely covering the first connection pad 240 serially. The second area 232b may be an area extending from the first area 232a and covering an edge portion of the first insulating layer 227 adjacent to the first connection pad 240.

As described above, when the second portion 232 of the side wirings covers the edge portion of the first insulating layer 227, the second portion 232 of the side wirings may secure a wider contact area than covering only the first connection pad 240. Accordingly, the second portion 232 of the side wirings may be stably coupled to the glass substrate 212 without being separated from the glass substrate 212.

The third portion 233 of the side wirings may cover the edge portion of the second insulating layer 228 formed on the rear surface of the glass substrate 212, similar to the second portion 232 of the side wirings.

An anti-oxidation layer may be formed on an upper surface of the second connection pad 250 to prevent oxidation of the second connection pad 245. In this example, the anti-oxidation layer may be formed to a thickness that enables electric connection between the second connection pad 250 and the third portion 233 of the side wirings.

An inorganic insulating layer 253 may be formed around the second connection pad 250. Accordingly, the second connection pad 250 may be insulated by the inorganic insulating layer 253 along the circumference.

The second insulating layer 228 formed on the rear surface of the glass substrate 212 may be formed of an organic insulating layer or an inorganic insulating layer or a structure in which an inorganic insulating layer and an organic insulating layer are stacked. The edge portion of the second insulating layer 228 may be spaced apart from the second connection pad 250 by a predetermined distance.

The third portion 233 of the side wirings may be divided into two areas 233a and 233b. The first area 233a may be an area extending from the first portion 231 of the side wirings and covering the second chamfer surface CS12 of the glass substrate and completely covering the second connection pad 250 serially. The second area 233b may be an area extending from the first area 233a and covering the edge portion of the second insulating layer 228 adjacent to the second connection pad 250.

As described above, when the third portion 233 of the side wirings covers the edge portion of the second insulating layer 228, the third portion 233 of the side wirings may secure a wider contact area than covering only the second connection pad 250. Accordingly, the third portion 233 of the side wirings may be more stably coupled to the glass substrate 212 without being separated from the glass substrate 212.

As shown in FIG. 20, the side wirings 230 have the second portion 232 covering the edge portion of the first insulating layer 227 and the third portion 233 covering the edge portion of the second insulating layer 228, but embodiments are not limited thereto. For example, the side wirings 230 may be configured such that the second portion 232 covers the edge portion of the first insulating layer 227 and the third portion 233 covers only the second connection pad 240. In addition, the side wirings 230 may be configured such that the second portion 232 covers only the second connection pad 250 and the third portion 233 covers the edge portion of the second insulating layer 228.

Referring to FIG. 20, SS10 is a side surface of the glass substrate 212 to which the first portion 231 of the side wirings is coupled.

Figure 21:
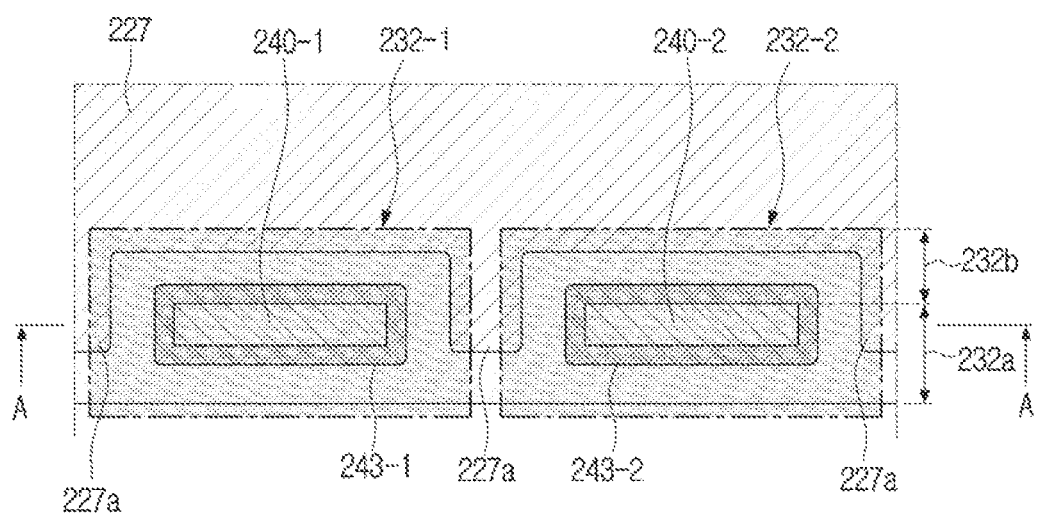
FIG. 21 is a plan view illustrating an example in which adjacent side wirings cover corresponding connection pads, respectively.
Figure 22:
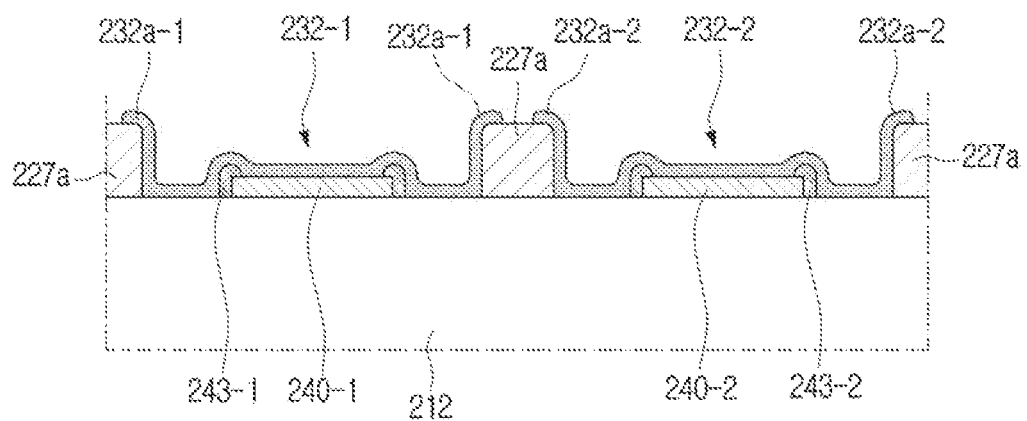
FIG. 22 is a cross-sectional view taken along line A-A shown in FIG. 21.

FIG. 21 is a plan view illustrating an example in which adjacent side wirings cover corresponding connection pads, respectively and FIG. 22 is a cross-sectional view taken along line A-A shown in FIG. 21.

In the embodiment, the side wirings disposed to be adjacent to each other may be connected such that both end portions (second and third portions) are in correspondence with one connection pad, respectively.

Referring to FIGS. 21 and 22, the second portion 232-1 of the first side wirings may be stacked on a first connection pad 240-1, and the second portion 232-2 of the other first side wirings disposed adjacent to the second portion 232-1 of the first side wirings may be stacked on one other first connection pad 240-1.

In this example, the edge of the first insulating layer 227 adjacent to the first connection pads 240-1 and 240-2 may be covered by the second portions 232-1 and 232-2 of the side wirings. The inorganic insulating layers 243-1 and 243-2 surrounding the first connection pads 240-1 and 240-2, respectively, may also be covered by the second portions 232-1 and 232-2 of the side wirings.

Protrusions 227a located between the first connection pads 240-1 and 240-2 may be formed at an edge portion of the first insulating layer 227. Accordingly, the protrusions 227a forming a part of the first insulating layer 227 may also be covered by the second portions 232-2 and 232-3 of the side wirings.

The third portions of the side wirings may also cover the edge portions of the second insulating layer formed on the rear surface of the glass substrate together with the second connection pads, respectively, similar to the second portions 232-1 and 232-2 of the side wirings.

Figure 23:
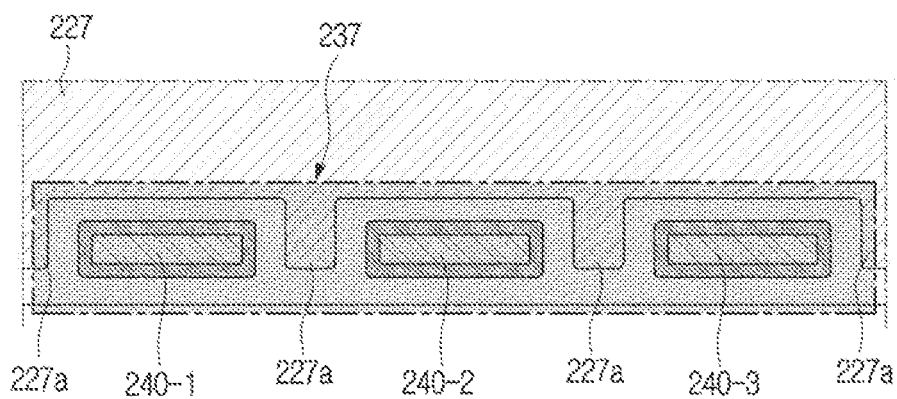
FIG. 23 is a plan view illustrating an example of covering a plurality of connection pads, by one side wiring, disposed adjacently.

FIG. 23 is a plan view illustrating an example of covering a plurality of connection pads, by one side wiring, disposed adjacently.

When at least two first connection pads transmit a single signal, the side wirings may cover all of the at least two first connection pads.

Referring to FIG. 23, the second portion 237 of one side wirings may cover the plurality of first connection pads 240-1, 240-2, and 240-3 at the same time. In addition, the second portion 237 of the side wirings may cover the edge portion of the first insulating layer 227.

The plurality of first connection pads 240-1, 240-2, and 240-3 transmitting a single signal may be arranged adjacent to each other.

The second portion 237 of the side wirings may further widen the contact area than when only one first connection pad is covered, so that the side wirings may be more firmly coupled to the glass substrate.

A third portion of the side wirings may also cover a plurality of adjacent second connection pads simultaneously transmitting a single signal, similar to the second portion. The second portion of the side wirings may cover the edge portion of the second insulating layer formed on the rear surface of the glass substrate.

Hereinafter, embodiments in which a coupling force between a connection pad and the side wirings may be more firmly maintained by the uneven structure.

Figure 24:
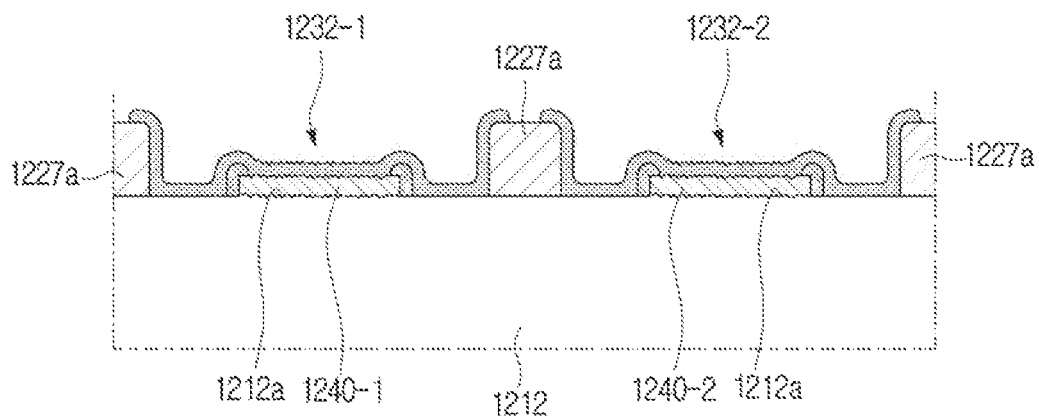
FIG. 24 is a cross-sectional view illustrating an example of forming an uneven portion on a glass substrate and forming a connection pad and side wirings.

FIG. 24 is a cross-sectional view illustrating an example of forming an uneven portion on a glass substrate and forming a connection pad and side wirings.

Referring to FIG. 24, before first connection pads 1240-1 and 1240-2 are formed a glass substrate 1212, the first connection pads 1240-1 and 1240-2 form a fine uneven portion 1212a on a partial area of the front surface of the glass substrate 1212 on which the first connection pads 1240-1 and 1240-2 are disposed. The fine uneven portions 1212a formed in a partial area of the front surface of the glass substrate 1212a may be formed through an etching process. In this example, an etching member may use, for example, hydrofluoric acid.

After forming the uneven portion 1212a on the glass substrate 1212, the first connection pads 1240-1 and 1240-2 are formed on the uneven portion 1212a. In this example, the first connection pads 1240-1 and 1240-2 may be formed on the uneven portion 1212a through, for example, a metal deposition process such as sputtering.

Since the first connection pads 1240-1 and 1240-2 are formed as a thin film, the first connection pads 1240-1 and 1240-2 are deposited along the profile of the uneven portion 1212a so as to have an uneven structure similar to the structure of the uneven portion 1212a of the glass substrate.

The side wirings may be formed on the glass substrate 1212 through a metal deposition process. In this example, since the second portions 1232-1 and 1232-2 of the side wirings are formed by deposition on the first connection pads 1240-1 and 1240-2, each having an uneven structure may be coupled on the first connection pads 1240-1 and 1240-2 while having an uneven structure naturally.

Accordingly, since the second portions 1232-1 and 1232-2 of the side wirings are unevenly coupled to the first connection pads 1240-1 and 1240-2, the contact area between the second portions 1232-1 and 1232-2 of the side wirings and the first connection pads 1240-1 and 1240-2 may increase.

The third portions of the side wirings and the corresponding second connection pads may also be formed in the same or similar combination as the uneven coupling between the second portions 1232-1 and 1232-2 of the side wirings and the first connection pads 1240-1 and 1240-2.

The side wirings may be coupled to the glass substrate 1212 more firmly by the uneven coupling.

FIG. 24 illustrates the protrusions of the first insulating layer 1227a.

Figure 25:
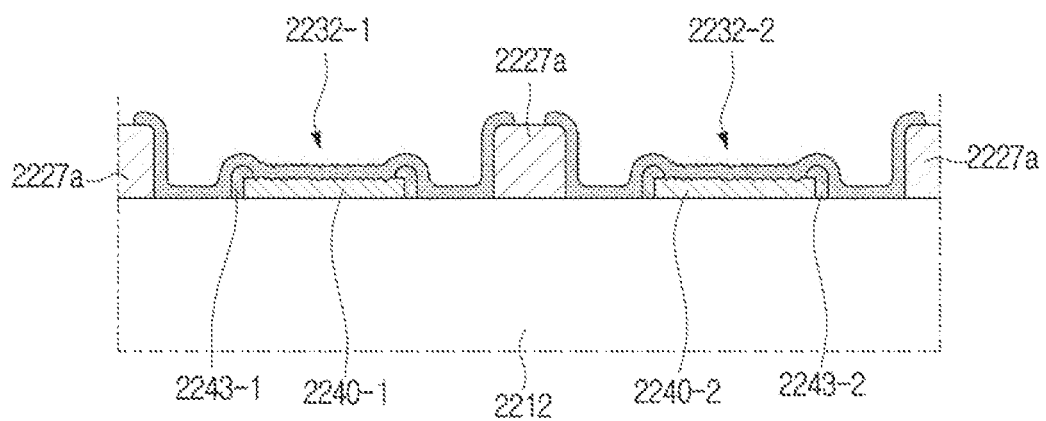
FIG. 25 is a cross-sectional view illustrating an example of forming a connection pad and side wirings after forming an uneven portion on metal wirings.

FIG. 25 is a cross-sectional view illustrating an example of forming a connection pad and side wirings after forming an uneven portion on metal wirings.

Referring to FIG. 25, after the first connection pads 2240-1 and 2240-2 are formed on the glass substrate 2212 without an uneven portion, a fine uneven structure is formed on the first connection pads 2240-1 and 2240-2 through a laser process.

The side wirings may be formed on the glass substrate 2212 through a metal deposition process. In this example, the second portions 2232-1 and 2232-2 of the side wirings may be formed by depositing along the surfaces of the first connection pads 2240-1 and 2240-2 having an uneven structure, so as to be unevenly coupled on the first connection pads 2240-1 and 2240-2. Accordingly, the contact area between the second portions 2232-1 and 2232-2 of the side wirings and the first connection pads 2240-1 and 2240-2 may increase.

The third portions of the side wirings and the corresponding second connection pads may also be coupled to the second portions 2232-1, 2232-2 and the first connection pads 2240-1 and 2240-2 in the same or similar manner as the second portions 2232-1 and 2232-2 and the first connection pads 2240-1 and 2240-2 of the side wirings.

By the uneven coupling, the side wirings may be coupled with the glass substrate 2212 more firmly.

FIG. 25 illustrates protrusions of the first insulating layer 2227a, and inorganic insulating films 2243-1 and 2243-2 surrounding the first connection pads 2240-1 and 2240-2, respectively.

Figure 26:
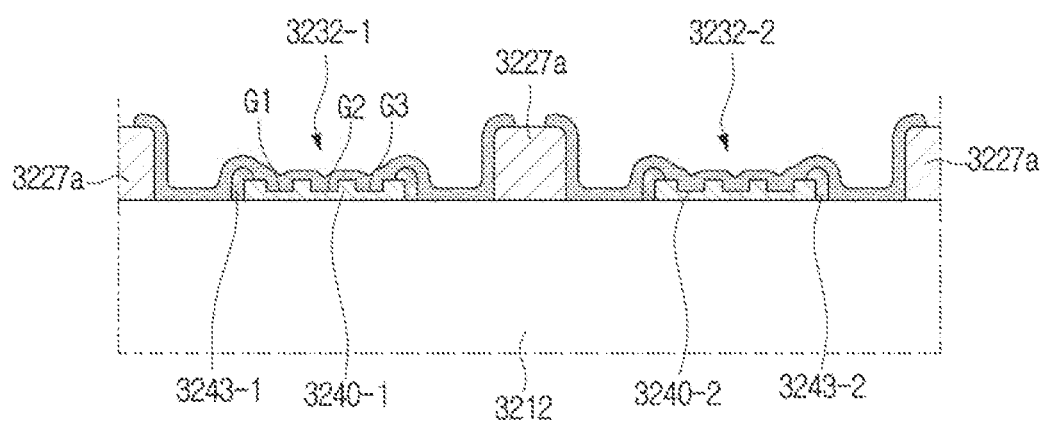
FIG. 26 is a cross-sectional view illustrating an example in which a plurality of grooves are formed in a connection pad and the side wirings are formed.
Figure 27:
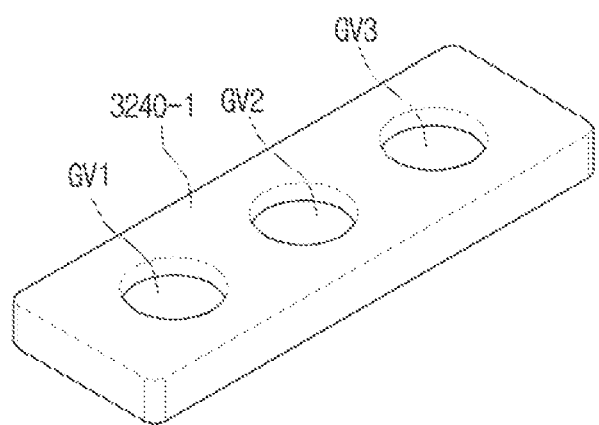
FIG. 27 is a perspective view of the connection pad shown in FIG. 26.
Figure 28:
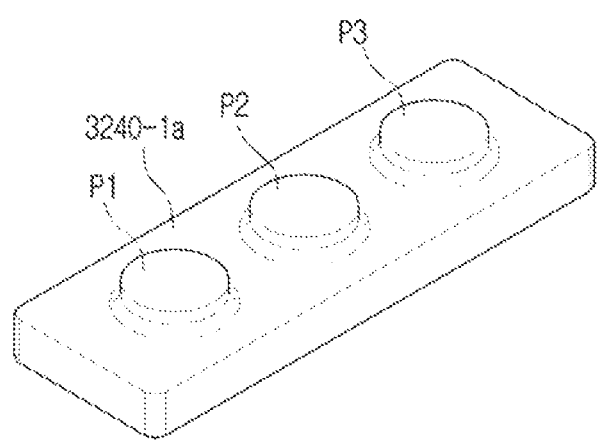
FIG. 28 is a perspective view illustrating an example of forming a plurality of protrusions on a connection pad.

FIG. 26 is a cross-sectional view illustrating an example in which a plurality of grooves are formed in a connection pad and the side wirings are formed; FIG. 27 is a perspective view of the connection pad shown in FIG. 26 and FIG. 28 is a perspective view illustrating an example of forming a plurality of protrusions on a connection pad.

Referring to FIGS. 26 and 27, first connection pads 3240-1 and 3240-2 may be formed with grooves GV1, GV2, and GV3 of a predetermined shape through an etching process on the upper surface thereof.

The grooves GV1, GV2, and GV3 may be formed by at least two or more depending on the area of the first connection pads 3240-1 and 3240-2. The grooves GV1, GV2, and GV3 may be arranged in one row along the longitudinal direction of the first connection pads 3240-1 and 3240-2, but embodiments are not limited thereto, and the grooves GV1, GV2, and GV3 may form a zigzag or irregular arrangement.

Accordingly, when the second portions 3232-1 and 3232-2 are deposited on the first connection pads 3240-1 and 3240-2, the second portions 3232-1 and 3232-2 may be combined with the first connection pads 3240-1 and 3240-2 by the grooves GV1, GV2, and GV3 unevenly.

The side wirings may be more firmly coupled to the glass substrate 3212 by the uneven coupling.

The second portions 3232-1 and 3232-2 of the side wirings may perform uneven coupling with the corresponding first connection pads 3240-1 and 3240-2 through the protrusions that are not the grooves GV1, GV2, and GV3 described above.

In FIG. 28, the first connection pad 3240-1a may have protrusions P1, P2, P3 on an upper surface with the predetermined height.

The second connection pads may also form the aforementioned recesses GV1, GV2, GV3, or protrusions P1, P2, and P3. In this example, the third portions of the side wirings that are deposited on the second connection pads may form uneven coupling with the second connection pads.

FIG. 26 also illustrates a protrusion of the first insulating layer 3227a, and inorganic insulating films 3243-1 and 3243-2 surrounding the first connection pads 3240-1 and 3240-2, respectively.

Figure 29:
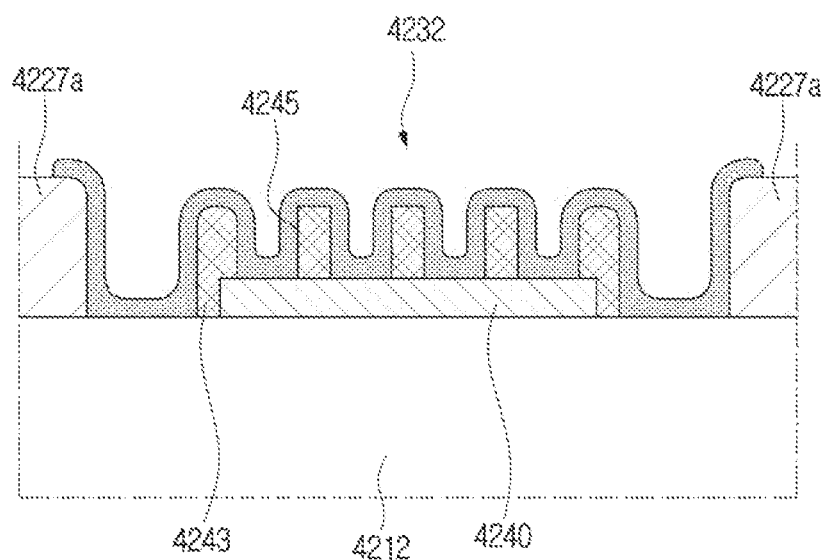
FIG. 29 is a cross-sectional view illustrating an example in which a plurality of via holes are formed in an organic insulating layer formed on an upper portion of a connection pad, and then side wirings are formed.

FIG. 29 is a cross-sectional view illustrating an example in which a plurality of via holes are formed in an organic insulating layer formed on an upper portion of a connection pad, and then side wirings are formed.

Referring to FIG. 29, after forming an inorganic insulating layer 4243 on a first connection pad 4240 at a predetermined thickness to completely cover the first connection pad 4240, via holes 4245 may be formed in the inorganic insulating layer 4243 through an etching process.

In the first connection pad 4240, an area corresponding to the via holes 4245 are exposed without being covered by the inorganic insulating layer 4243. In this state, when the side wirings are formed on the glass substrate 4212 through the metal deposition process, the second portion 4232 of the side wirings may be formed on the inorganic insulating layer 4243 at a predetermined thickness.

In this example, the second portion 4232 of the side wirings may be electrically connected to the first connection pad 4240 through the via holes 4245. This uneven coupling allows the side wirings to be more firmly coupled to the glass substrate 4212.

The third portion of the side wirings and the second connection pad corresponding to the third portion of the side wirings may also be coupled to the second portion 4232 of the side wirings and the first connection pads 4240 in the same or similar uneven coupling state.

FIG. 29 also illustrates protrusions of the first insulating layer 4227a.

Figure 30:
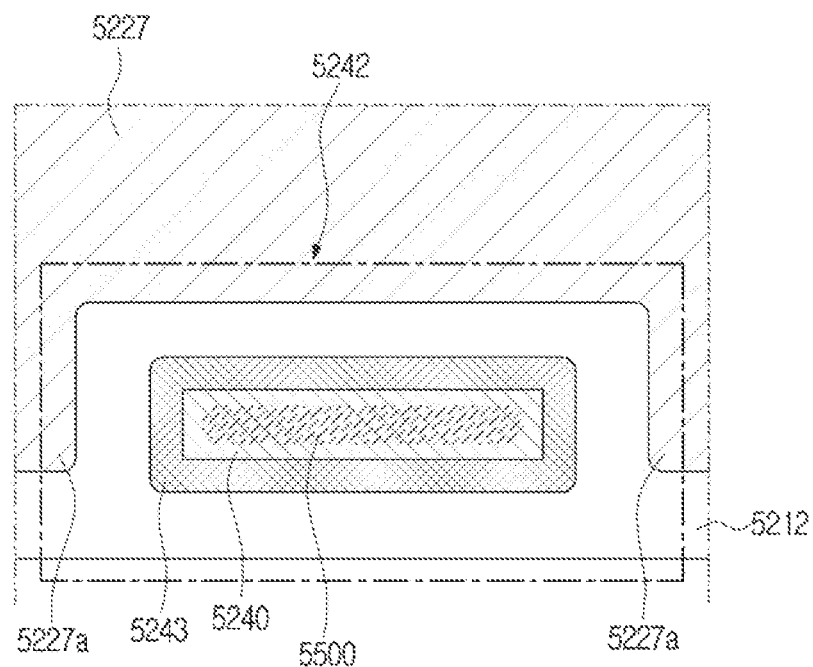
FIG. 30 is a plan view illustrating a welding area on which a laser beam is radiated on side wirings.

FIG. 30 is a plan view illustrating a welding area on which a laser beam is radiated on side wirings.

Referring to FIG. 30, in a state where a second portion 5242 of the side wirings covers the edge portion of a first connection pad 5240 and a first insulating layer 5227, a laser beam may be radiated to an area where the second portion 5242 of the side wirings overlaps the first connection pad 5240 to form a welding portion 5500.

As shown in FIG. 25, in the welding portion 5500, an uneven structure may be formed on the second portion 5242 of the side wirings and the first connection pad 5240 as shown in FIG. 25.

When the welding portion 5500 is formed on the third portion of the side wirings and the overlapping portion of the second connection pad corresponding to the third portion, the third portion of the side wirings and the corresponding second connection pad may be coupled to the second portion 5232 of the side wirings and the first connection pads 5240 in the same or similar uneven coupling state.

FIG. 30 also illustrates protrusions of the first insulating layer 5227a.

Figure 31:
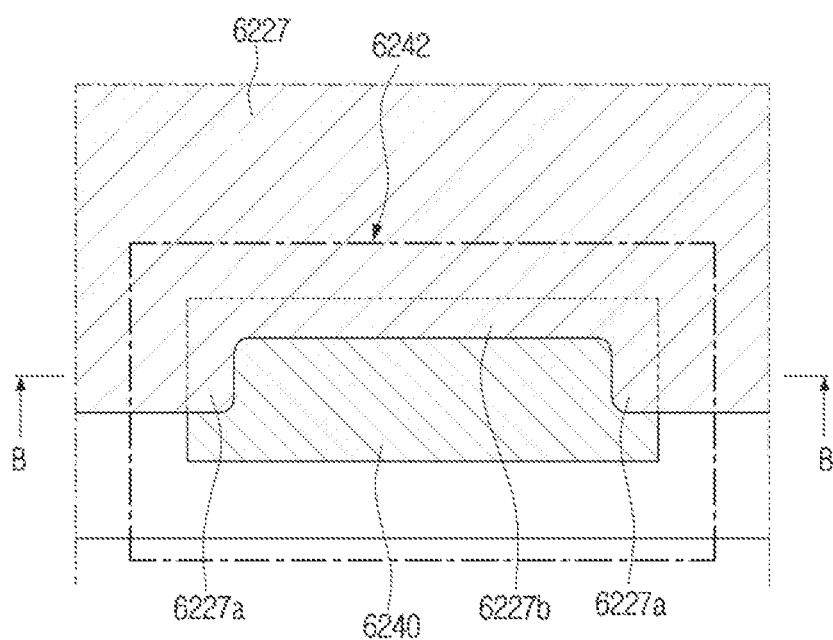
FIG. 31 is a plan view illustrating an example in which a portion of the connection pad is covered by the insulating layer and the side wirings cover the connection pad and the edge portion of the insulating layer together.
Figure 32:
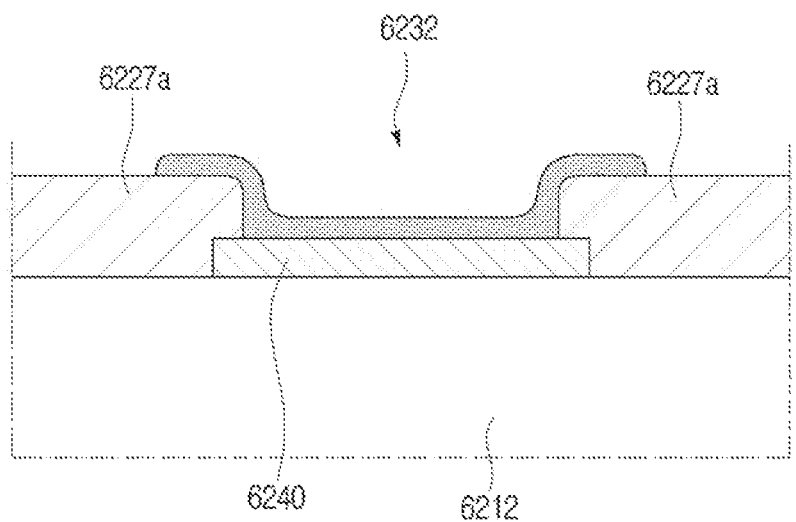
FIG. 32 is a cross-sectional view taken along line B-B shown in FIG. 31.

FIG. 31 is a plan view illustrating an example in which a portion of the connection pad is covered by the insulating layer and the side wirings cover the connection pad and the edge portion of the insulating layer together, and FIG. 32 is a cross-sectional view taken along line B-B shown in FIG. 31.

A first insulating layer 6227 may be formed to cover a portion of a first connection pad 6240. For example, as shown in FIG. 31, the first connection pad 6240 may be partially covered by the edge portion of the first connection pad 6240 and the remaining portion may be exposed.

Referring to FIGS. 31 and 32, the second portion 6232 of the side wirings may cover the first connection pad 6240 and the edge portion of the first insulating layer 6227 together. The center of a second portion 6232 of the side wirings may be electrically connected to the first connection pad 6240 and both sides may cover protrusions 6227a of a first insulating layer 7227.

A second insulating layer formed on the rear surface of the glass substrate 6212 may cover a portion of the second connection pad. In this example, the third portion of the side wirings may cover the second connection pad corresponding to the third portion and the edge portion of the second insulating layer together.

The second and third portions of the side wiring may be more firmly coupled to the glass substrate as the area in contact with the glass substrate increases.

While embodiments of the disclosure have been shown and described, the disclosure is not limited to the aforementioned embodiments, and it is apparent that various modifications can be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A display module comprising:
   a glass substrate;
   a thin film transistor (TFT) layer provided on a front surface of the glass substrate;
   a driving circuit provided on a rear surface of the glass substrate, the driving circuit being configured to drive the TFT layer;
   a plurality of light emitting diodes (LED) electrically connected to the TFT layer;
   a plurality of first connection pads provided at intervals in a portion of the front surface of the glass substrate that is adjacent to a lateral surface of the glass substrate, the plurality of first connection pads being electrically connected to a TFT circuit provided in the TFT layer through a plurality of first wirings;
   a plurality of second connection pads provided at intervals in a portion of the rear surface of the glass substrate adjacent to the lateral surface of the glass substrate, the plurality of second connection pads being electrically connected to the driving circuit through a plurality of second wirings; and
   a plurality of side wirings extending from the lateral surface of the glass substrate to a portion of an insulating layer by passing the first connection pads and extending to another portion of the insulating layer by passing the second connection pads,
   wherein the first connection pads have an uneven portion.

2. The display module of claim 1, wherein the insulating layer is an organic insulating film or an inorganic insulating film provided on the front surface of the glass substrate and the rear surface of the glass substrate.

3. The display module as claimed in claim 1, wherein the insulating layer comprises:
a first insulating layer provided on the front surface of the glass substrate; and
a second insulating layer provided on the rear surface of the glass substrate.

4. The display module of claim 3, wherein the first insulating layer is spaced apart from the first connection pads, and the second insulating layer is spaced apart from the second connection pads.

5. The display module of claim 3, wherein the first insulating layer is provided on a portion of the first connection pads.

6. The display module as claimed in claim 3, wherein the second insulating layer is provided on a portion of the second connection pads.

7. The display module of claim 1, wherein the portion of the front surface of the glass substrate that is adjacent to the lateral surface of the glass substrate has an uneven portion, and
wherein the first connection pads and one end of the side wirings that are sequentially stacked on the uneven portion of the glass substrate have an uneven shape.

8. The display module of claim 1, wherein one end of the side wirings stacked on the uneven portion of the first connection pads have an uneven shape.

9. The display module of claim 1, further comprising a via structure formed of an insulating material is provided on the first connection pads,
wherein a portion of the side wirings provided on the via structure has an uneven shape and is electrically connected to the first connection pads.

10. The display module of claim 1, wherein the glass substrate comprises an edge area comprising a first edge zone corresponding to a side surface of the glass substrate, a second edge zone corresponding to a portion of the front surface adjacent to the side surface, and a third edge zone corresponding to a portion of the rear surface adjacent to the side surface,
wherein the plurality of side wirings are provided at predetermined intervals, and
wherein each side wiring among the plurality of side wirings is configured such that a width of a first portion formed in the first edge zone is larger than a width of a second portion formed in the second edge zone and a width of a third portion formed in the third edge zone.

11. The display module of claim 10, wherein an interval between the first portions of adjacent side wirings is smaller than a width of each of the second portions and the third portions.

12. The display module of claim 10, wherein an interval between the first portions of adjacent side wirings is smaller than an interval between the second portions of the adjacent side wirings and an interval between the third portions of the adjacent side wirings.

13. The display module of claim 10, wherein the first portion of the side wirings comprise a first section extending from a point connected to the second portions to a first predetermined distance away from the second portion and a second section extending from a point connected to the third portion to a second predetermined distance away from the third portion.

14. The display module of claim 13, wherein the first portion of the side wirings comprises a third section with a predetermined width provided between the first section and the second section.

15. The display module of claim 10, wherein the first edge zone of the glass substrate comprises a trench increasing a planar distance of the first portions of adjacent side wirings,
wherein the glass substrate further comprises an insulating member coupled along the trench, and
wherein the insulating member protrudes higher than the first portions of the adjacent side wirings from the side surface of the glass substrate.

16. A display module comprising:
a glass substrate;
a thin-film-transistor (TFT) layer provided on a front surface of the glass substrate;
a driving circuit provided on a rear surface of the glass substrate, the driving circuit being configured to drive the TFT layer;
light emitting diodes (LEDs) electrically connected to the TFT layer;
first connection pads electrically connected to a TFT circuit provided on the TFT layer provided on a portion of the front surface of the glass substrate that is adjacent to a lateral surface of the glass substrate;
second connection pads electrically connected to the driving circuit provided on a portion of the rear surface of the glass substrate adjacent to the lateral surface of the glass substrate;
side wirings provided on the first connection pads and the second connection pads, the side wirings being configured to electrically connect the first connection pads and the second connection pads;
a first insulating layer provided on the front surface of the glass substrate; and
a second insulating layer provided on the rear surface of the glass substrate,
wherein the side wirings extend to a portion of the first insulating layer or a portion of the second insulating layer, and
wherein the first connection pads or the second connection pads have an uneven portion.

17. The display module as claimed in claim 16,
wherein a portion of the side wirings is provided on the uneven portion.

18. The display module as claimed in claim 16, wherein a portion of the front surface of the glass substrate or a portion of the rear surface of the glass substrate has an uneven portion, and
wherein a portion of the side wirings is provided on the uneven portion of the glass substrate.

19. The display module as claimed in claim 16, wherein a via structure formed of an insulating material is provided on the first connection pads, and
wherein a portion of the side wirings provided on the via structure has an uneven shape corresponding to the via structure.

20. The display module as claimed in claim 16, wherein the first connection pads, the second connection pads, and the side wirings are provided at predetermined intervals, and
wherein each side wiring among the side wirings is configured such that a width of first portions provided on the lateral surface of the glass substrate is larger than a width of second portions provided on the front surface of the glass substrate and a width of third portions provided on the rear surface of the glass substrate.

* * * * *